US012666842B2

(12) United States Patent
Lee et al.

(10) Patent No.: US 12,666,842 B2
(45) Date of Patent: Jun. 23, 2026

(54) DISPLAY DEVICE WITH LIGHT CONTROL PATTERNS

(71) Applicant: Samsung Display Co., Ltd., Yongin-si (KR)

(72) Inventors: Seon Uk Lee, Seongnam-si (KR); Yeogeon Yoon, Seoul (KR); Donchan Cho, Seongnam-si (KR); Jaebeom Choi, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 938 days.

(21) Appl. No.: 17/940,398

(22) Filed: Sep. 8, 2022

(65) Prior Publication Data

US 2023/0157120 A1 May 18, 2023

(30) Foreign Application Priority Data

Nov. 18, 2021 (KR) ........................ 10-2021-0159458

(51) Int. Cl.
| | |
|---|---|
| *H10K 59/38* | (2023.01) |
| *G02B 5/20* | (2006.01) |

(Continued)

(52) U.S. Cl.
CPC ............. *H10K 59/38* (2023.02); *G02B 5/201* (2013.01); *H10K 50/865* (2023.02); *H10K 59/12* (2023.02); *H10K 71/00* (2023.02)

(58) Field of Classification Search
CPC ...... H10K 59/38; H10K 50/865; H10K 59/12; H10K 71/00; H10K 59/877; H10K 2102/331; H10K 59/875; H10K 50/85; H10K 59/873; H10K 59/879; H10K 59/1201; H10K 2102/3026; H10K 59/35; H10K 50/8445; H10K 50/856; H10K 50/858; H10K 59/122; G02B 5/201; H10H 29/142

See application file for complete search history.

(56) References Cited

U.S. PATENT DOCUMENTS

| | | | |
|---|---|---|---|
| 8,766,288 B2 | 7/2014 | Chen et al. | |
| 9,303,153 B2 * | 4/2016 | Nick ................... | C09K 11/703 |

(Continued)

FOREIGN PATENT DOCUMENTS

| | | | |
|---|---|---|---|
| KR | 1020070049172 A | 5/2007 | |
| KR | 1020170124071 A | 11/2017 | |

(Continued)

*Primary Examiner* — Caleb E Henry
(74) *Attorney, Agent, or Firm* — CANTOR COLBURN LLP

(57) ABSTRACT

A display device, in which a plurality of pixel units respectively including a first pixel area, a second pixel area, a third pixel area, and a fourth pixel area are defined, includes a third light-emitting element corresponding to the third pixel area, and a fourth light-emitting element corresponding to the fourth pixel area, a first color filter portion overlapping the third pixel area, and a second color filter portion overlapping the fourth pixel area, where the first color filter portion of one pixel unit and the second color filter portion of another pixel unit adjacent to the one pixel unit are integrally formed with each other as a single unitary indivisible part to define a third color filter.

22 Claims, 13 Drawing Sheets

(51) Int. Cl.

| | |
|---|---|
| *H10K 50/86* | (2023.01) |
| *H10K 59/12* | (2023.01) |
| *H10K 71/00* | (2023.01) |

(56) References Cited

U.S. PATENT DOCUMENTS

| | | | | |
|---|---|---|---|---|
| 9,331,285 | B2 * | 5/2016 | Mizuki | H10K 85/40 |
| 9,365,701 | B2 * | 6/2016 | Nick | C09D 5/22 |
| 9,534,313 | B2 * | 1/2017 | Linton | C30B 7/08 |
| 9,711,665 | B2 * | 7/2017 | Wagenblast | H10F 19/80 |
| 9,874,674 | B2 * | 1/2018 | Coe-Sullivan | G02B 6/0043 |
| 9,902,687 | B2 * | 2/2018 | Ito | H10K 85/654 |
| 9,929,325 | B2 * | 3/2018 | Mahan | G02B 6/0003 |
| 9,951,438 | B2 * | 4/2018 | Breen | C30B 29/48 |
| 10,211,271 | B2 | 2/2019 | Kim et al. | |
| 10,247,985 | B2 * | 4/2019 | Qi | G02F 1/133606 |
| 10,263,191 | B2 * | 4/2019 | Mizuki | H05B 33/20 |
| 10,539,826 | B2 | 1/2020 | Lee et al. | |
| 11,637,157 | B2 * | 4/2023 | Choi | H10K 59/352 |
| | | | | 257/40 |
| 12,039,925 | B2 | 7/2024 | Kim et al. | |
| 12,058,911 | B2 | 8/2024 | Park et al. | |
| 2007/0090755 | A1 * | 4/2007 | Eida | B82Y 20/00 |
| | | | | 313/506 |
| 2008/0036367 | A1 | 2/2008 | Eida et al. | |
| 2012/0194494 | A1 * | 8/2012 | Jung | G02F 1/1341 |
| | | | | 349/123 |
| 2015/0001486 | A1 * | 1/2015 | Kim | H10K 59/122 |
| | | | | 438/23 |
| 2015/0029441 | A1 * | 1/2015 | Kang | G02B 6/0091 |
| | | | | 362/613 |
| 2015/0198842 | A1 * | 7/2015 | Kwak | H10D 86/60 |
| | | | | 257/43 |
| 2015/0200240 | A1 * | 7/2015 | Cho | H10D 64/62 |
| | | | | 257/43 |
| 2017/0110522 | A1 * | 4/2017 | Lee | H10K 50/856 |
| 2017/0125740 | A1 * | 5/2017 | Lee | H10K 59/80515 |
| 2019/0148460 | A1 * | 5/2019 | Kim | H10K 59/879 |
| | | | | 257/40 |
| 2019/0172874 | A1 * | 6/2019 | Lim | H10K 59/879 |
| 2019/0181202 | A1 * | 6/2019 | Lim | H10K 50/19 |
| 2019/0189701 | A1 * | 6/2019 | Bang | H10K 59/122 |
| 2019/0312228 | A1 * | 10/2019 | Sonoda | H10K 59/8722 |
| 2019/0371872 | A1 * | 12/2019 | Nendai | H10K 59/80515 |
| 2020/0006438 | A1 * | 1/2020 | Gong | H10K 59/122 |
| 2020/0185638 | A1 * | 6/2020 | Choi | H10K 59/38 |
| 2020/0219937 | A1 * | 7/2020 | Ahn | H10K 59/8792 |
| 2020/0321400 | A1 * | 10/2020 | Park | H10K 59/38 |
| 2021/0043690 | A1 * | 2/2021 | Sim | H10K 59/38 |
| 2021/0202587 | A1 | 7/2021 | Kim et al. | |
| 2021/0202606 | A1 * | 7/2021 | Kim | H10K 59/353 |
| 2021/0202653 | A1 * | 7/2021 | Cho | H10K 71/00 |
| 2021/0217835 | A1 * | 7/2021 | Park | H10K 50/844 |
| 2021/0234134 | A1 * | 7/2021 | Qi | H10K 59/8731 |
| 2021/0249478 | A1 * | 8/2021 | Oh | H10K 59/38 |
| 2021/0273022 | A1 * | 9/2021 | Park | G02B 5/26 |
| 2021/0280750 | A1 * | 9/2021 | Park | H10H 20/8513 |

FOREIGN PATENT DOCUMENTS

| | | |
|---|---|---|
| KR | 1020180062053 A | 6/2018 |
| KR | 1020200047947 A | 5/2020 |
| KR | 1020200135727 A | 12/2020 |
| KR | 1020210012181 A | 2/2021 |
| KR | 102223421 B1 | 3/2021 |
| KR | 1020210101380 A | 8/2021 |
| KR | 1020210122406 A | 10/2021 |

* cited by examiner

DISPLAY DEVICE WITH LIGHT CONTROL PATTERNS

This application claims priority to Korean Patent Application No. 10-2021-0159458, filed on Nov. 18, 2021, and all the benefits accruing therefrom under 35 U.S.C. § 119, the content of which in its entirety is herein incorporated by reference.

BACKGROUND

1. Field

Embodiments of the disclosure described herein relate to a display device with improved display quality.

2. Description of the Related Art

The display device includes a transmissive display device that selectively transmits source light generated from a light source therethrough and a light-emitting display device that generates source light from the display device itself. The display device may include different types of light control patterns depending on pixels to create a color image. The light control pattern may transmit only a partial wavelength range of the source light therethrough or may change a color of the source light. Some light control patterns may change characteristics of the light without changing the color of the source light.

SUMMARY

A display device displays an image using pixel areas that display red, green, and blue, respectively. When a black object is displayed on a white background or a white object is displayed on a black background, an edge discoloration phenomenon in which a color other than white is displayed at a boundary therebetween may occur. A method for reducing such edge discoloration is desired.

Embodiments of the disclosure provide a display device with improved display quality.

According to an embodiment, a display device in which an active area including a plurality of pixel units which respectively includes a first pixel area, a second pixel area, a third pixel area, and a fourth pixel area and respectively provides a source light, and a peripheral area adjacent to the active area are defined, includes a plurality of light-emitting elements including a first light-emitting element corresponding to the first pixel area, a second light-emitting element corresponding to the second pixel area, a third light-emitting element corresponding to the third pixel area, and a fourth light-emitting element corresponding to the fourth pixel area, a first color filter overlapping the first pixel area, a second color filter overlapping the second pixel area, a first color filter portion overlapping the third pixel area, and a second color filter portion overlapping the fourth pixel area, a first light control pattern disposed between the first color filter and the first light-emitting element, a second light control pattern disposed between the second color filter and the second light-emitting element, a first light control pattern portion disposed between the first color filter portion and the third light-emitting element, and a second light control pattern portion disposed between the second color filter portion and the fourth light-emitting element, wherein the first light control pattern portion of one pixel unit and the second light control pattern portion of another pixel unit adjacent to the one pixel unit may be integrally formed with each other as a single unitary indivisible part to define a third light control pattern.

In an embodiment, the first pixel area and the second pixel area may be spaced apart from each other in a first direction, where the third pixel area and the fourth pixel area may be spaced apart from each other in a second direction intersecting the first direction, where the first pixel area and the third pixel area may be spaced apart from each other in a first intersecting direction intersecting the first direction and the second direction, where the first pixel area and the fourth pixel area may be spaced apart from each other in a second intersecting direction intersecting the first intersecting direction, the first direction and the second direction.

In an embodiment, the first color filter portion of the one pixel unit and the second color filter portion of the another pixel unit may be integrally formed with each other as a single unitary indivisible part to define a third color filter.

In an embodiment, the display device may further include a partitioning wall, and a plurality of first openings may be defined in the partitioning wall in which the first light control pattern, the second light control pattern, and the third light control pattern may be disposed, respectively.

In an embodiment, the third color filter may be disposed on the partitioning wall, the first color filter may be disposed on the third color filter, and the second color filter may be disposed on the first color filter.

In an embodiment, a second opening may be defined in the partitioning wall to be spaced apart from the plurality of first openings in a plan view.

In an embodiment, the second opening may be disposed between third light control patterns adjacent to each other in the plan view.

In an embodiment, the first light control pattern may convert the source light into a first color light, the second light control pattern may transmit the source light therethrough, and the third light control pattern may convert the source light into a second color light different from the first color light.

In an embodiment, the first color light may be a red light, and the second color light may be a green light.

In an embodiment, sizes of the first to fourth pixel areas may be equal to each other.

In an embodiment, the source light may be a blue light.

In an embodiment, the peripheral area may include a first peripheral area adjacent to a first side of the active area, and a second peripheral area adjacent to a second side of the active area spaced apart from the first side, and the third color filter may be further disposed in the first peripheral area and the third color filter may be not disposed in the second peripheral area.

In an embodiment, the first peripheral area may include a first area and a second area spaced apart from the active area with the first area interposed therebetween, the second peripheral area may include a third area and a fourth area spaced apart from the active area with the third area interposed therebetween, and the device may further include a black matrix disposed in the second area and the fourth area.

In an embodiment, a size of the first area may be larger than a size of the third area.

In an embodiment, the third color filter may overlap with at least two light-emitting elements in a plan view.

According to an embodiment, a display device includes a first substrate including a plurality of light-emitting elements which respectively provides a source light, and a second substrate disposed on the first substrate, where the second substrate includes a plurality of color filters including a first color filter, a second color filter, and a third color filter, where the third color filter includes a first color filter portion and a second color filter portion, and a first light control pattern, a second light control pattern, and a third light control pattern, where the third light control pattern includes a first light control pattern portion and a second light control pattern portion, where the first color filter, the second color filter, the first color filter portion, and the second color filter portion overlap the plurality of light-emitting elements, respectively, in a plan view, and in the plan view, the first light control pattern overlaps the first color filter, the second light control pattern overlaps the second color filter, the first light control pattern portion overlaps the first color filter portion, and the second light control pattern portion overlaps the second color filter portion.

In an embodiment, the first color filter may be spaced apart from the second color filter in the first direction, wherein the third color filter may be spaced apart from the first color filter in a first intersecting direction intersecting the first direction, wherein the third color filter may be spaced apart from the second color filter in a second intersecting direction intersecting the first intersecting direction and the first direction.

In an embodiment, the source light may be a blue light.

In an embodiment, an active area and a peripheral area adjacent to the active area may be defined in the first substrate, where the peripheral area may include a first peripheral area adjacent to a first side of the active area, and a second peripheral area adjacent to a second side of the active area spaced apart from the first side of the active area, where the first peripheral area may include a first area and a second area spaced apart from the first area with the active area interposed therebetween, where the first area may overlap the first color filter, the first color filter portion, the second color filter, and the third color filter in the plan view, wherein the second peripheral area may include a third area and a fourth area spaced apart from the third area with the active area interposed therebetween, where the third area may overlap the first color filter, the first color filter portion, and the second color filter in the plan view.

In an embodiment, the second substrate may further include a black matrix disposed in the second area and the fourth area.

According to an embodiment, a display device includes a base substrate, a display element layer disposed on the base substrate, where the display element layer includes a plurality of light-emitting elements which provides a source light, a plurality of first light control patterns disposed on the display element layer, where the plurality of first light control patterns converts the source light into first color light, a plurality of second light control patterns disposed on the display element layer, where the plurality of second light control patterns transmits the source light therethrough, and a plurality of third light control patterns disposed on the display element layer, where the plurality of third light control patterns converts the source light into second color light different from the first color light, where each of the plurality of third light control patterns may overlap two light-emitting elements of the plurality of light-emitting elements.

In an embodiment, the display device may further include a first color filter disposed on each of the plurality of first light control patterns, a second color filter disposed on each of the plurality of second light control patterns, and a third color filter disposed on each of the plurality of third light control patterns.

In an embodiment, the source light may be a blue light.

In an embodiment, the first color light may be a red light, and the second color light may be a green light.

In embodiments of the invention, as described above, one pixel unit may include the first to the fourth pixel areas, the third pixel area and the fourth pixel area may be areas that provides a same color as each other. In such embodiments, the first pixel area and the second pixel area may be spaced apart from each other in the first direction, and the third pixel area and the fourth pixel area may be spaced apart from each other in the second direction. In such embodiments, the edge discoloration phenomenon at each of the top edge and the bottom edge may be improved by the arrangement relationship of the pixel units. Accordingly, overall edge discoloration phenomenon of the pixel unit may be improved such that the display device may have improved display quality.

In embodiments of the invention, the third pixel area of one pixel unit and the fourth pixel area of another pixel unit adjacent to one pixel unit may overlap one light control pattern and one color filter. Accordingly, because the light control pattern and the color filter are not provided to the third pixel area and the fourth pixel area included in another pixel unit, but are connected with each other, process efficiency may be improved.

BRIEF DESCRIPTION OF THE DRAWINGS

The above and other objects of the disclosure will become apparent by describing in detail embodiments thereof with reference to the accompanying drawings, in which.

DETAILED DESCRIPTION

Figure 1A:
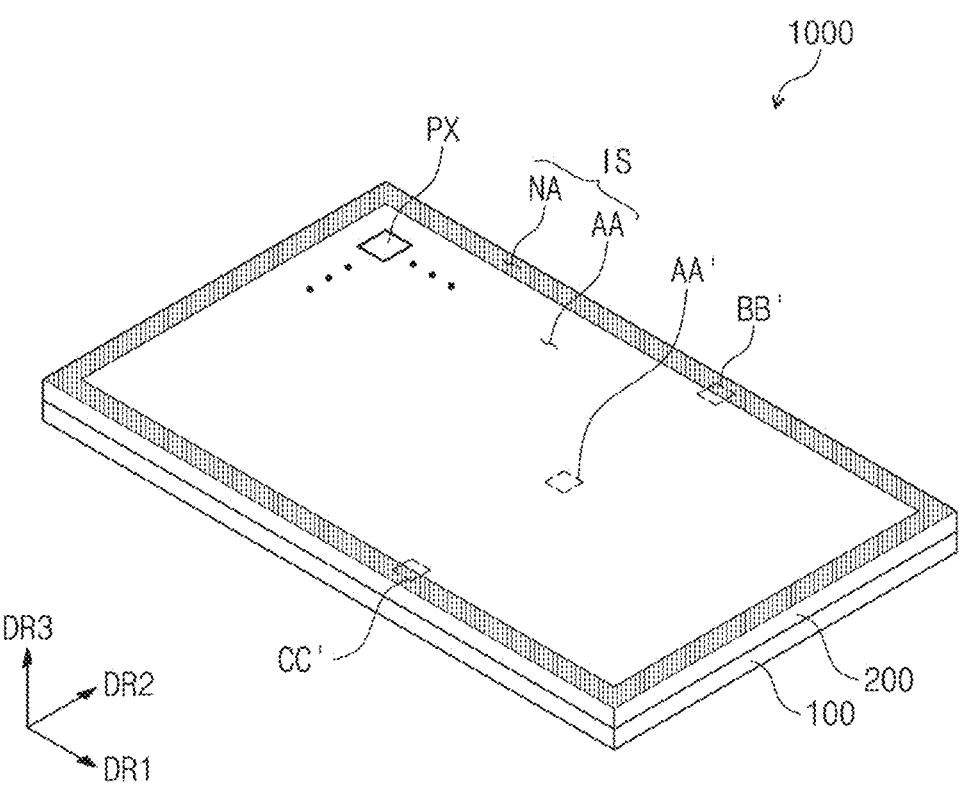
FIG. 1A is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Like reference numerals refer to like elements. Further, in the drawings, thicknesses, ratios, and dimensions of components are exaggerated for effective description of technical content. "Or" means "and/or." As used herein, the term "and/or" includes any and all combinations of one or more of the associated listed items.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. In contrast, when an element is referred to as being "directly on" another element, there are no intervening elements present.

The terminology used herein is for the purpose of describing particular embodiments only and is not intended to limit the disclosure. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the drawings.

Figure 1B:
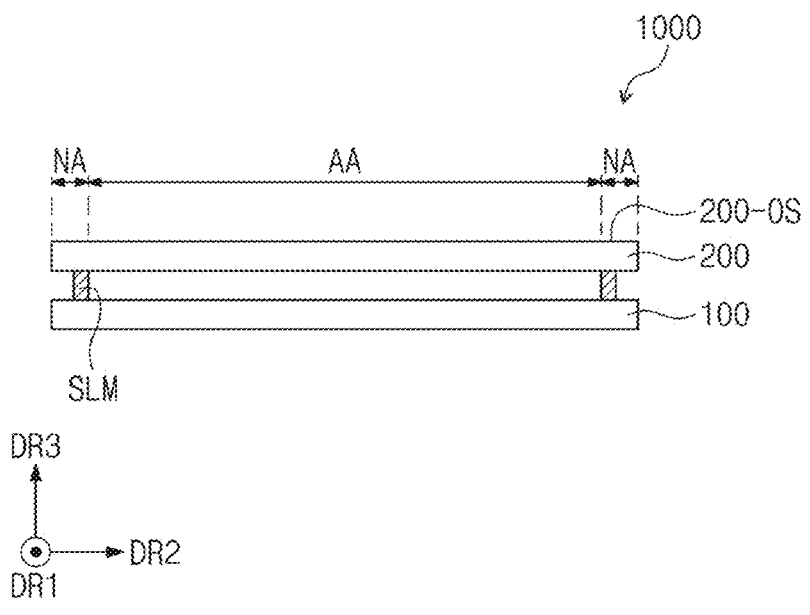
FIG. 1B is a cross-sectional view of a display device according to an embodiment of the disclosure.

FIG. 1A is a perspective view of a display device according to an embodiment of the disclosure, and FIG. 1B is a cross-sectional view of a display device according to an embodiment of the disclosure.

Referring to FIG. 1A and FIG. 1B, an embodiment of a display device 1000 may be configured to actually generate an image. The display device 1000 may be a light-emitting display device or a light-receiving display device. In an embodiment, for example, the display device 1000 may be any one of an organic light-emitting display device, a quantum dot light-emitting display device, a micro light emitting diode ("LED") display device, a nano LED display device, a liquid crystal display device, an electrophoretic display device, an electrowetting display device, and a micro-electromechanical systems ("MEMS") display device. The disclosure is not particularly limited thereto.

The display device 1000 may include a first substrate 100 (or a lower display substrate) and a second substrate 200 (or an upper display substrate) facing and spaced apart from the first substrate 100. A predetermined cell gap may be formed between the first substrate 100 and the second substrate 200. The cell gap may be maintained by a sealant SLM bonding the first substrate 100 and the second substrate 200 to each other. An insulating material may be filled in the cell gap.

In an embodiment, a gray level display layer for image creation may be disposed between a base substrate of the first substrate 100 and a base substrate of the second substrate 200. The gray level display layer may include a liquid crystal layer, an organic light-emitting layer, an inorganic light-emitting layer (for example, a quantum dot light-emitting layer, an LED light-emitting layer), or an electrophoretic layer depending on a type of display device 1000.

The display device 1000 may display an image through a display surface IS. An outer surface 200-0S of the second substrate 200 shown in FIG. 1B may be defined as the display surface IS of FIG. 1A.

The display surface IS may be parallel to a plane defined by a first direction DR1 and a second direction DR2. The display surface IS may include an active area AA and a peripheral area NA. A pixel PX may be disposed in the active area AA and the pixel PX may not be disposed in the peripheral area NA. The peripheral area NA may be defined around an edge of the display surface IS. In an embodiment, the peripheral area NA may surround the active area AA. In an alternative embodiment, the peripheral area NA may be omitted or may be disposed only on one side of the active area AA.

A third direction DR3 may indicate a normal direction to the display surface IS, that is, a thickness direction of the display device 1000. A front surface (or a top face) and a rear face (or a bottom face) of each of layers or each of units as described below may be distinguished by the third direction DR3.

Although an embodiment where the display device 1000 has the flat display surface IS is illustrated in FIG. 1A, the disclosure is not limited thereto. Alternatively, the display device 1000 may include a curved display surface or a three-dimensional display surface. The three-dimensional display surface may include a plurality of display areas indicating different directions.

Figure 2:
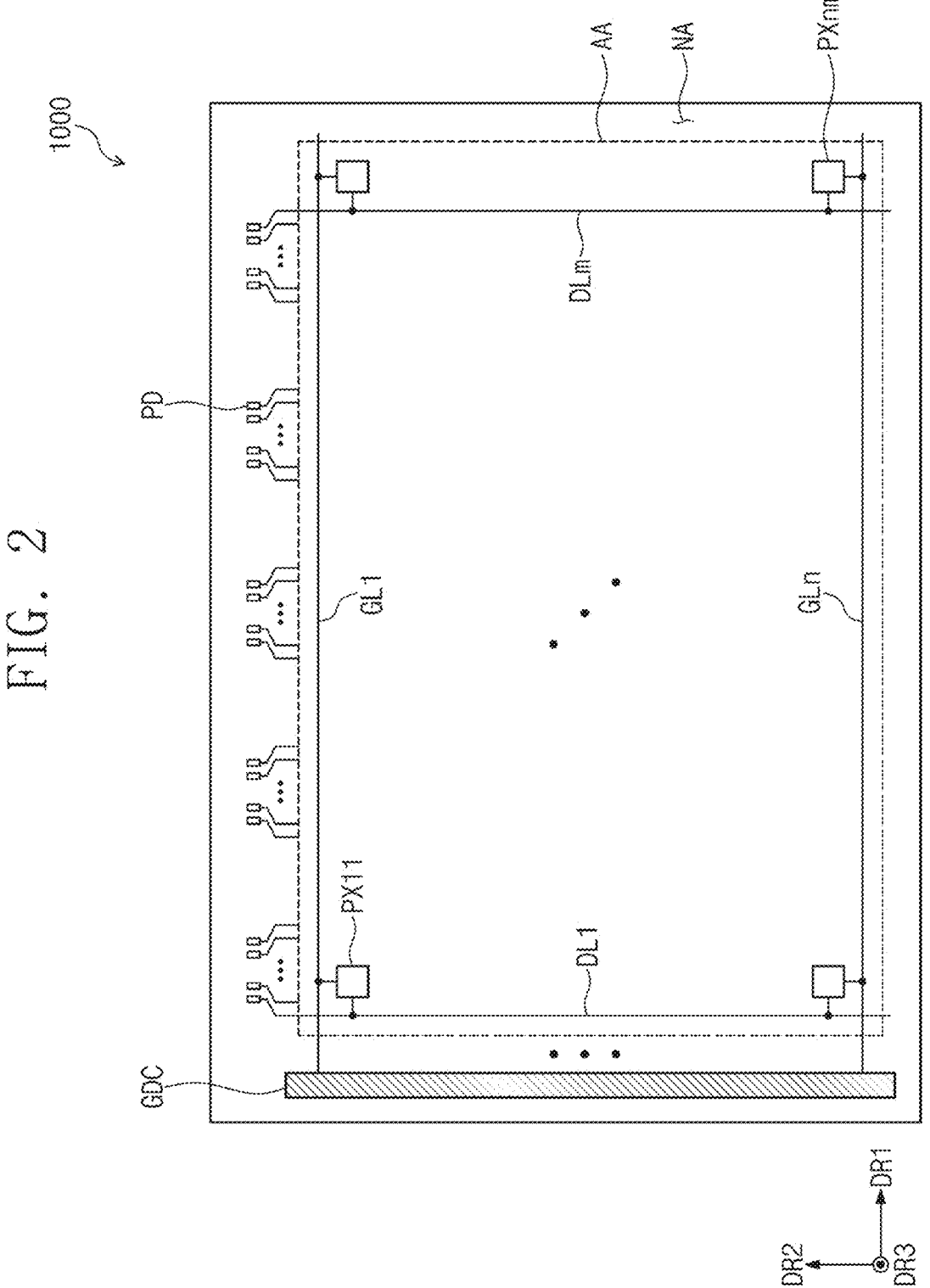
FIG. 2 is a plan view of a display device according to an embodiment of the disclosure.

FIG. 2 is a plan view of a display device according to an embodiment of the disclosure.

FIG. 2 shows a planar arrangement relationship of a plurality of signal lines GL1 to GLn, DL1 to DLm, and pixels PX11 to PXnm in an embodiment. The plurality of signal lines GL1 to GLn and DL1 to DLm may include a plurality of gate lines GL1 to GLn and a plurality of data lines DL1 to DLm.

In an embodiment, the display device 1000 may include the active area AA and the peripheral area NA adjacent to the active area AA. The active area AA and the peripheral area NA may be distinguished from each other based on whether or not a plurality of pixels PX11 to PXnm are disposed therein. The plurality of pixels PX11 to PXnm may be disposed in the active area AA and not in the peripheral area NA.

Each of the plurality of pixels PX11 to PXnm may be connected to a corresponding gate line of the plurality of gate lines GL1 to GLn and a corresponding data line of the plurality of data lines DL1 to DLm. Each of the plurality of pixels PX11 to PXnm may include a pixel driving circuit and a display element. Other types of signal lines may be provided in the display device 1000 according to a configuration of the pixel driving circuit of each of the plurality of pixels PX11 to PXnm.

A scan driving circuit GDC and a plurality of pads PD may be disposed in the peripheral area NA. The scan driving circuit GDC may be formed through a same process as a process in which circuits in the display device 1000 are formed. A data driving circuit may be a partial circuit configured in the driving chip, and the driving chip may be electrically connected to the plurality of pixels PX11 to PXnm through the pads PD disposed in the peripheral area NA.

Figure 3:
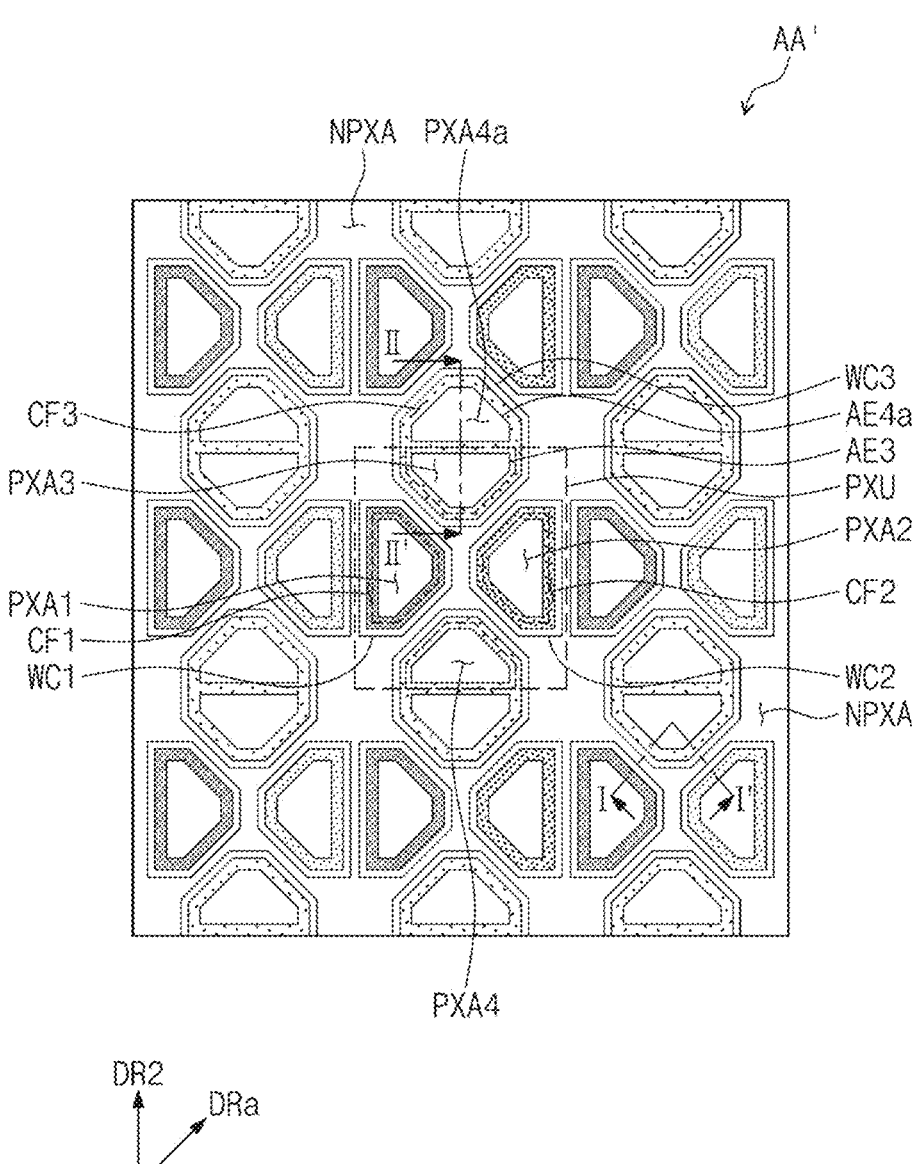
FIG. 3 is a plan view showing an AA' area of FIG. 1A according to an embodiment of the disclosure.

FIG. 3 is a plan view showing an area AA' of FIG. 1A according to an embodiment of the disclosure.

FIG. 3 shows a plurality of pixel areas PXA1, PXA2, PXA3, and PXA4 when viewed from above the outer surface 200-0S of the second substrate 200 shown in FIG. 1B.

Referring to FIG. 3, each of the plurality of pixel areas PXA1, PXA2, PXA3, and PXA4 may be an area corresponding to an area in which each of the plurality of pixels PX shown in FIG. 2 is defined. A peripheral area NPXA may be defined adjacent to the plurality of pixel areas PXA1, PXA2, PXA3, and PXA4. The peripheral area NPXA may define boundaries of the plurality of pixel areas PXA1, PXA2, PXA3, and PXA4, and may prevent color mixing between the plurality of pixel areas PXA1, PXA2, PXA3, and PXA4.

In an embodiment, four pixel areas PXA1, PXA2, PXA3, and PXA4 may constitute one pixel unit PXU. A plurality of pixel units PXU may be provided in the active area AA, and the plurality of pixel units PXU may be arranged along the first direction DR1 and the second direction DR2.

The first pixel area PXA1 and the second pixel area PXA2 may be spaced apart from each other in the first direction DR1.

The third pixel area PXA3 and the fourth pixel area PXA4 may be spaced apart from each other in the second direction DR2.

The first pixel area PXA1 and the third pixel area PXA3 may be spaced apart from each other in a first intersecting (or diagonal) direction DRa. The first intersecting direction DRa may intersect the first direction DR1 and the second direction DR2.

The first pixel area PXA1 and the fourth pixel area PXA4 may be spaced apart from each other in a second intersecting direction DRb. The second intersecting direction DRb may intersect the first intersecting direction DRa.

A shape of the first pixel area PXA1 and a shape of the second pixel area PXA2 may be symmetrical with each other with respect to an axis extending in the second direction DR2. A shape of the third pixel area PXA3 and a shape of the fourth pixel area PXA4 may be symmetrical with each other respect to an axis extending in the first direction DR1. In an embodiment, sizes of the first to the fourth pixel areas PXA1, PXA2, PXA3, and PXA4 may be the same as each other. However, this is an example. Sizes of the first to the fourth pixel areas PXA1, PXA2, PXA3, and PXA4 according to an embodiment of the disclosure are not limited thereto. In an alternative embodiment, for example, sizes of the first to the fourth pixel areas PXA1, PXA2, PXA3, and PXA4 may be different from each other.

Conventionally, each of pixel areas for providing red light, green light, and blue light may have a stripe shape. In a display device using quantum dots, a rectangular pixel area having a stripe shape may reduce efficiency of quantum dots. According to an embodiment of the disclosure, the efficiency of quantum dots may be improved as a shape of the pixel area has a polygon closer to a circle. Each of the first to the fourth pixel areas PXA1, PXA2, PXA3, and PXA4 may have a polygonal shape. In an embodiment, for example, each of the first to the fourth pixel areas PXA1, PXA2, PXA3, and PXA4 may have a polygonal shape closer to a semicircle. Therefore, in such an embodiment, the display device 1000 may have improved quantum dot efficiency.

In one pixel unit PXU, the peripheral area NPXA may have an 'X' shape.

The first pixel area PXA1 may overlap with a first color filter CF1. The first pixel area PXA1 may provide first color light. In an embodiment, the first color light may be red light, for example. The first pixel area PXA1 and the first color filter CF1 may overlap a first light control pattern WC1.

The second pixel area PXA2 may overlap a second color filter CF2. The second pixel area PXA2 may provide second color light different from the first color light. In an embodiment, the second color light may be blue light, for example. The second pixel area PXA2 and the second color filter CF2 may overlap a second light control pattern WC2.

The third pixel area PXA3 of one pixel unit PXU and the fourth pixel area PXA4 of another pixel unit adjacent to the third pixel area PXA3 may overlap a third color filter CF3. The third pixel area PXA3 and the fourth pixel area PXA4 may provide third color light different from the first color light and the second color light. In an embodiment, the third color light may be a green light, for example. However, this is an example. The first to third color light according to an embodiment of the disclosure are not limited thereto. In an alternative embodiment, for example, the third color light may be red light or blue light. The third pixel area PXA3 of one pixel unit PXU, the fourth pixel area PXA4 of another pixel unit adjacent to the third pixel area PXA3, and the third color filter CF3 may overlap a third light control pattern WC3.

Figure 4:
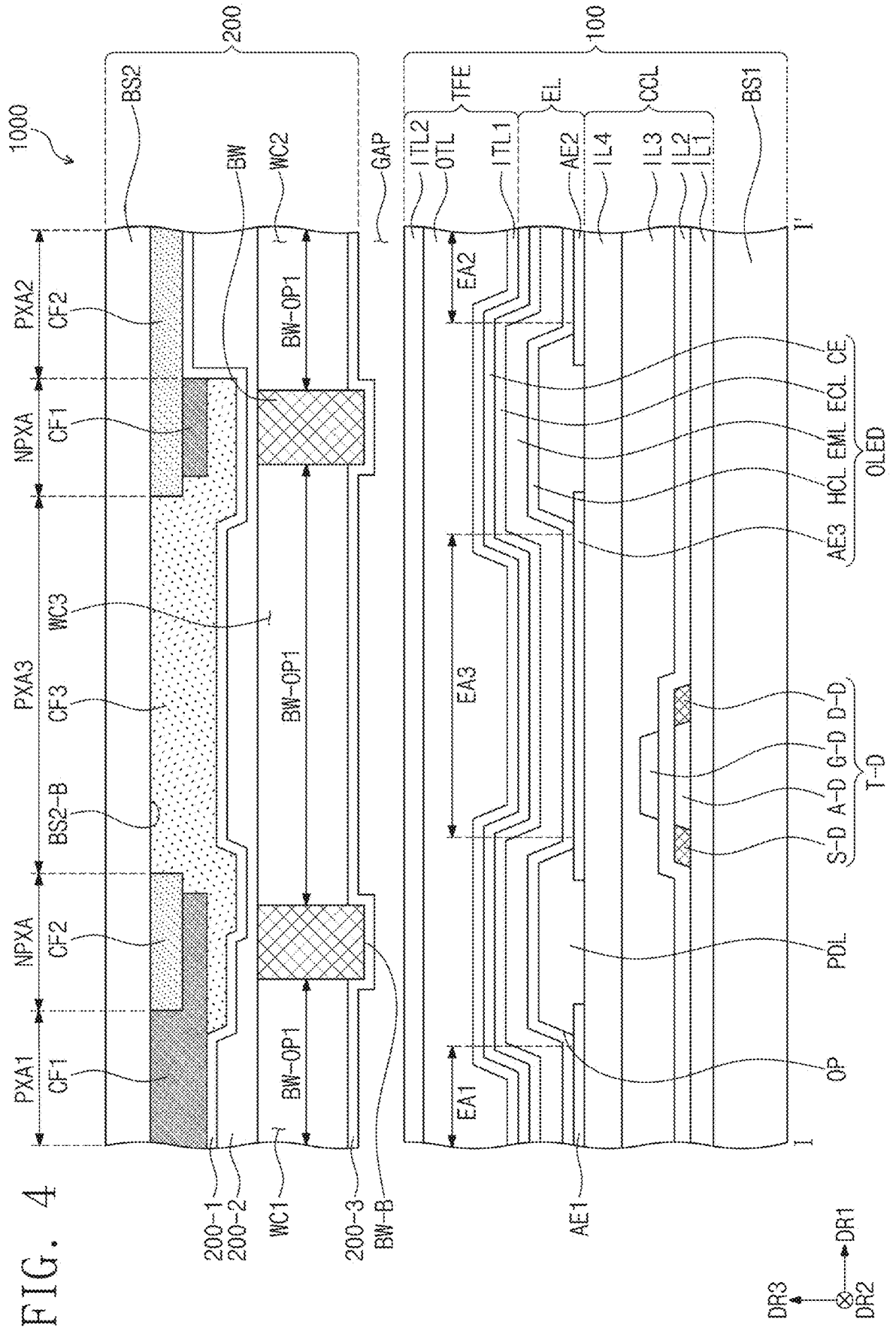
FIG. 4 is a cross-sectional view taken along I-I' of FIG. 3 according to an embodiment of the disclosure.

FIG. 4 is a cross-sectional view taken along I-I' of FIG. 3 according to an embodiment of the disclosure.

Referring to FIG. 3 and FIG. 4, an embodiment of the display device 1000 may include the first substrate 100 (or the lower display substrate) and the second substrate 200 or (the upper display substrate) spaced apart from the first substrate 100. A predetermined cell gap GAP may be formed between the first substrate 100 and the second substrate 200. The cell gap GAP may be maintained by a sealant SLM (See FIG. 1B) bonding the first substrate 100 and the second substrate 200 to each other. The sealant SLM may be disposed in the peripheral area NDA as shown in FIG. 1B. In an embodiment of the disclosure, a synthetic resin material may be disposed in the cell gap GAP.

The first pixel area PXA1, the second pixel area PXA2, the third pixel area PXA3, the fourth pixel area PXA4, and the peripheral area NPXA may be defined in the display device 1000.

The first substrate 100 may include a first base substrate BS1 (or a base substrate), a circuit layer CCL, a display element layer EL, and a thin-film encapsulation layer TFE. The circuit layer CCL may be disposed on the first base substrate BS1. The circuit layer CCL may include a plurality of insulating layers, a plurality of conductive layers, and a semiconductor layer. The display element layer EL may be disposed on the circuit layer CCL. The thin-film encapsulation layer TFE may be disposed on the display element layer EL, and may encapsulate the display element layer EL.

The first base substrate BS1 may be a silicon substrate, a plastic substrate, a glass substrate, an insulating film, or a stack structure including a plurality of insulating layers.

The circuit layer CCL may include a plurality of transistors and a plurality of insulating layers IL1, IL2, IL3, and IL4. In FIG. 4, only one driving transistor T-D is shown for convenience of illustration and description. The plurality of insulating layers IL1, IL2, IL3, and IL4 may include the first insulating layer IL1, the second insulating layer IL2, the third insulating layer IL3, and the fourth insulating layer IL4.

The first insulating layer IL1 may be disposed on the first base substrate BS1, and the driving transistor T-D may be disposed on the first insulating layer IL1. The driving transistor T-D may include an active A-D, a source S-D, a drain D-D, and a gate G-D.

The active A-D, the source S-D, and the drain D-D may be distinguished from each other based on a doping concentration or conductivity of a semiconductor pattern. The active A-D, the source S-D, and the drain D-D may be disposed on the first insulating layer ILL The active A-D, the source S-D, and the drain D-D may have higher adhesion to the first insulating layer IL1 than to the first base substrate BS1.

In an embodiment, the first insulating layer IL1 may be a barrier layer for protecting bottom surfaces of the active A-D, the source S-D, and the drain D-D. In such an embodiment, the first insulating layer IL1 may prevent contamination or moisture entering from the first base substrate BS1 itself or through the first base substrate BS1 from invading into the active A-D, the source S-D, and the drain D-D. Alternatively, the first insulating layer IL1 may be a light blocking layer that prevents external light incident through the first base substrate BS1 from being incident on the active A-D. In such an embodiment, the first insulating layer IL1 may further include a light blocking material.

The second insulating layer IL2 may be disposed on the first insulating layer IL1 and may cover the active A-D, the source S-D, and the drain D-D. The second insulating layer IL2 may include an inorganic material. The inorganic material may include at least one selected from silicon nitride, silicon oxy nitride, silicon oxide, titanium oxide, and aluminum oxide.

The gate G-D may be disposed on the second insulating layer IL2. The third insulating layer IL3 may be disposed on the second insulating layer IL2 and may cover the gate G-D. The third insulating layer IL3 may be composed of a single layer or a plurality of layers. In an embodiment, for example, the single layer may include an inorganic layer. The plurality of layers may include an organic layer and an inorganic layer.

The fourth insulating layer IL4 may be disposed on the third insulating layer IL3. The fourth insulating layer IL4 may be composed of or defined by a single layer or a plurality of layers. In an embodiment, for example, the single layer may include an organic layer. The plurality of layers may include an organic layer and an inorganic layer. The fourth insulating layer IL4 may be a planarization layer that provides a flat surface on elements therebelow.

The display element layer EL may be disposed on the fourth insulating layer IL4. The display element layer EL may include a light-emitting element OLED and a pixel defining film PDL. In an embodiment, the light-emitting element OLED may be an organic light-emitting diode, but is not limited thereto. In an alternative embodiment, for example, the light-emitting element OLED may be a micro LED element or a nano LED element. The pixel defining film PDL may be an organic layer.

The light-emitting element OLED may include a first electrode AE3 (hereafter, a third pixel electrode), a hole control layer HCL, a light-emitting layer EML, an electron control layer ECL, and a second electrode CE (or a common electrode). The third pixel electrode AE3 may be provided separately for each pixel. The light-emitting element OLED may include a first light-emitting element overlapping the first pixel area PXA1, a second light-emitting element overlapping the second pixel area PXA2, a third light-emitting element overlapping the third pixel area PXA3, and a fourth light-emitting element overlapping the fourth pixel area PXA4. In an embodiment, as shown in FIG. 4, the light-emitting element OLED may include a first pixel electrode AE1 included in the first light-emitting element, a second pixel electrode AE2 included in the second light-emitting element, and the third pixel electrode AE3 included in the third light-emitting element.

The first pixel electrode AE1 may be disposed in a corresponding manner to the first pixel area PXA1, the second pixel electrode AE2 may be disposed in a corresponding manner to the second pixel area PXA2, and the third pixel electrode AE3 may be disposed in a corresponding manner to the third pixel area PXA3. As used herein, "corresponding" means that two components overlap each other in the thickness direction DR3 of the display device 1000, and is not limited to a configuration that the two components have a same area as each other.

The first pixel electrode AE1, the second pixel electrode AE2, and the third pixel electrode AE3 may be disposed on the fourth insulating layer IL4. Each of the first pixel electrode AE1, the second pixel electrode AE2, and the third pixel electrode AE3 may be directly or indirectly electrically connected to a corresponding driving transistor. In an embodiment, for example, the second pixel electrode AE2 may be directly or indirectly connected to the driving transistor T-D shown in FIG. 4. In FIG. 4, a connection structure between the second pixel electrode AE2 and the driving transistor T-D is not shown.

The pixel defining film PDL may expose a portion of each of the first pixel electrode AE1, the second pixel electrode AE2, and the third pixel electrode AE3. In an embodiment, for example, light-emitting openings OP may be defined in the pixel defining film PDL. A portion of each of the first pixel electrode AE1, the second pixel electrode AE2, and the third pixel electrode AE3 may be exposed through each of the light-emitting openings OP.

A first light-emitting area EA1, a second light-emitting area EA2, and a third light-emitting area EA3 may be defined by the light-emitting openings OP, respectively. In an embodiment, the first light-emitting area EA1 may be defined to correspond to the first pixel area PXA1, the second light-emitting area EA2 may be defined to correspond to the second pixel area PXA2, and the third light-emitting area EA3 may be defined to correspond to the third pixel area PXA3. As used herein, "corresponding" means that the two components overlap each other in the thickness direction DR3 of the display device 1000, and is not limited to a confirmation that the two components have a same area as each other.

The hole control layer HCL, the light-emitting layer EML, the electron control layer ECL, and the second electrode CE may be commonly disposed in the first pixel area PXA1, the second pixel area PXA2, the third pixel area PXA3, and the peripheral area NPXA. The hole control layer HCL may include a hole transport layer, and may further include a hole injection layer.

The light-emitting layer EML may have a single-layer structure or a tandem structure. The light-emitting layer EML may generate blue light as a source light. Blue light may include light in a wavelength range of about 410 nanometers (nm) to about 480 nm. The light-emitting spectrum of blue light may have a peak wavelength in a range of about 440 nm to about 460 nm. In an embodiment, the light-emitting layer EML may be commonly disposed in the first to fourth pixel areas PXA1, PXA2, PXA3, and PXA4. Alternatively, the light-emitting layer EML may be disposed independently therein. In such an embodiment, the light-emitting layers EML disposed respectively in the first to fourth pixel areas PXA1, PXA2, PXA3, and PXA4 are separated from each other.

The electron control layer ECL includes an electron transport layer, and may further include an electron injection layer. The second electrode CE may be disposed on the electron control layer ECL. The second electrode CE may be commonly disposed in the plurality of pixels PX (see FIG. 1A).

The thin-film encapsulation layer TFE may be disposed on the second electrode CE. In an embodiment, for example, the thin-film encapsulation layer TFE may be disposed directly on the display element layer EL. The thin-film encapsulation layer TFE may include a first inorganic encapsulation layer ITL1, an organic encapsulation layer OTL, and a second inorganic encapsulation layer ITL2, which are sequentially stacked one on another. The organic encapsulation layer OTL may be disposed between the first inorganic encapsulation layer ITL1 and the second inorganic encapsulation layer ITL2. The first inorganic encapsulation layer ITL1 and the second inorganic encapsulation layer ITL2 may be formed by depositing an inorganic material, and the organic encapsulation layer OTL may be formed by depositing, printing, or coating an organic material.

The first inorganic encapsulation layer ITL1 and the second inorganic encapsulation layer ITL2 may protect the display element layer EL from moisture and oxygen, and the organic encapsulation layer OTL may protect the display element layer EL from foreign substances such as dust particles. Each of the first inorganic encapsulation layer ITL1 and the second inorganic encapsulation layer ITL2 may include at least one selected from silicon nitride, silicon oxynitride, silicon oxide, titanium oxide, and aluminum oxide. The organic encapsulation layer OTL may include a polymer, for example, an acrylic based organic layer. However, this is an example and the disclosure is not limited thereto.

FIG. 4 illustrates an embodiment where the thin-film encapsulation layer TFE includes two inorganic layers and one organic layer, but the disclosure is not limited thereto. In an alternative embodiment, for example, the thin-film encapsulation layer TFE may include three inorganic layers and two organic layers. In such an embodiment, the inorganic and organic layers may be alternately stacked with each other. Although not shown, the display device 1000 may further include a refractive index control layer on a top face of the thin-film encapsulation layer TFE to improve light output efficiency.

The second display substrate 200 may be disposed on the first display substrate 100. The second display substrate 200 may include a second base substrate BS2 (or a cover base substrate), the first color filter CF1, the second color filter CF2, the third color filter CF3, the first light control pattern WC1, the second light control pattern WC2, the third light control pattern WC3, a partitioning wall BW, and a plurality of insulating layers 200-1, 200-2, and 200-3.

The second base substrate BS2 may be a silicon substrate, a plastic substrate, a glass substrate, an insulating film, or a stack structure including a plurality of insulating layers. A bottom surface BS2-B of the second base substrate BS2 may be flat.

The plurality of color filters CF1, CF2, and CF3 may be disposed on one surface of the second base substrate BS2. In an embodiment, for example, the plurality of color filters CF1, CF2, and CF3 may be disposed on a bottom surface of the second base substrate BS2. The first color filter CF1 may be disposed to overlap the first light-emitting area EA1, the second color filter CF2 may be disposed to overlap the second light-emitting area EA2, and the third color filter CF3 may be disposed to overlap the third light-emitting area EA3.

The second color filter CF2 may be disposed in the second pixel area PXA2 and the peripheral area NPXA. A plurality of openings may be defined in the second color filter CF2. The plurality of openings may define the first pixel area PXA1 and the third pixel area PXA3. The first color filter CF1 may be disposed to overlap the first pixel area PXA1, and the third color filter CF3 may be disposed to overlap the third pixel area PXA3.

The third color filter CF3 may be disposed on the partitioning wall BW and in the peripheral area NPXA. The first color filter CF1 may be disposed on the third color filter CF3. The second color filter CF2 may be disposed on the first color filter CF1.

Each of the first to third color filters CF1, CF2, and CF3 transmits light in a specific wavelength range therethrough, and blocks light outside the specific wavelength range. Each of the first to third color filters CF1, CF2, and CF3 includes a base resin and a dye and/or pigment dispersed in the base resin. The base resin may be a medium in which dyes and/or pigments are dispersed, and may include or be composed of various resin compositions that may be generally referred to as binders.

The first color filter CF1 may transmit the first color light therethrough, the second color filter CF2 may transmit source light provided from the light-emitting layer EML therethrough, and the third color filter CF3 may transmit the third color light therethrough. In an embodiment, for example, the first color filter CF1 may be a red color filter, the second color filter CF2 may be a blue color filter, and the third color filter CF3 may be a green color filter. In an embodiment of the disclosure, each of the first color filter CF1 and the third color filter CF3 may be a yellow color filter. In such an embodiment, the first color filter CF1 and the third color filter CF3 may be connected to each other.

The first color filter CF1 may be disposed adjacent to the second color filter CF2. The third color filter CF3 may overlap the first color filter CF1 and the second color filter CF2. An area in which all of the plurality of color filters CF1, CF2, and CF3 overlap each other may block light. In such an embodiment, the device may not include a black matrix (not shown) that includes a light-blocking material. An area in which all of the plurality of color filters CF1, CF2, and CF3 overlap each other may correspond to the peripheral area NPXA and may correspond to the partitioning wall BW. As used herein, "corresponding" means that the two components overlap each other in the thickness direction DR3 of the display panel DP, and is not limited to a configuration that the two components have a same area as each other.

The first insulating layer 200-1 may be disposed under the first color filter CF1, the second color filter CF2, and the third color filter CF3, and may cover the first color filter CF1, the second color filter CF2, and the third color filter CF3. The second insulating layer 200-2 may cover the first insulating layer 200-1 and may provide a flat surface as a bottom surface thereof. The first insulating layer 200-1 may be an inorganic film, and the second insulating layer 200-2 may be an organic film. However, this is an example. Alternatively, the second insulating layer 200-2 may be omitted.

The partitioning wall BW may be disposed under the second insulating layer 200-2. The partitioning wall BW may be disposed in the peripheral area NPXA. A plurality of first openings BW-OP1 may be defined in the partitioning wall BW. The partitioning wall BW may include a material having a transmittance smaller than or equal to a predetermined value. In an embodiment, the partitioning wall BW may include a light-blocking material, for example, a conventional black component. The partitioning wall BW may include black dye and black pigment mixed with a base resin. In an embodiment, for example, the partitioning wall BW may include at least one selected from propylene glycol methyl ether acetate, 3-methoxy-n-butyl acetate, acrylate monomer, acrylic monomer, organic pigment, and acrylate ester.

The bottom surface BW-B of the partitioning wall BW may be defined as a surface facing the thin-film encapsulation layer TFE.

The plurality of first openings BW-OP1 may correspond to the first pixel area PXA1, the second pixel area PXA2, and the third pixel area PXA3, respectively. The plurality of first openings BW-OP1 may correspond to the first light-emitting area EA1, the second light-emitting area EA2, and the third light-emitting area EA3, respectively. As used herein, "corresponding" means that the two components overlap each other in the thickness direction DR3 of the display panel DP, and is not limited to a configuration that the two components have a same area as each other.

The first light control pattern WC1 may be disposed inside one of the plurality of first openings BW-OP1, and may convert the source light into the first color light. The second light control pattern WC2 may be disposed inside one of the plurality of first openings BW-OP1, and may transmit the source light therethrough. The third light control pattern WC3 may be disposed inside one of the plurality of first openings BW-OP1, and may convert the source light into the second color light.

Each of the first light control pattern WC1, the second light control pattern WC2, and the third light control pattern WC3 may be formed by an inkjet process. Each of compositions may be provided into spaces defined in the partitioning wall BW, for example, each of the plurality of first openings BW-OP1 to form each of the first light control pattern WC1, the second light control pattern WC2, and the third light control pattern WC3.

Each of the first light control pattern WC1 and the third light control pattern WC3 may include a base resin, quantum dots, and scattering particles, and the second light control pattern WC2 may include a base resin and scattering particles. However, this is an example. Alternatively, each of the first light control pattern WC1, the second light control pattern WC2, and the third light control pattern WC3 may include a base resin and scattering particles, and at least two of the first light control pattern WC1, the second light control pattern WC2, and the third light control pattern WC3 may include quantum dots. In an alternative embodiment of the disclosure, the scattering particles may be omitted from any one of the first light control pattern WC1, the second light control pattern WC2, and the third light control pattern WC3.

The base resin may be a medium in which quantum dots, or scattering particles are dispersed, and may include or be composed of various resin compositions that may be generally referred to as binders. However, the disclosure is not limited thereto. As long as a medium is capable of dispersing quantum dots therein, the medium may be referred to as a base resin regardless of its name, other additional functions, constituent materials, and the like. The base resin may be a polymer resin. In an embodiment, for example, the base resin may be an acrylic resin, a urethane-based resin, a silicone-based resin, or an epoxy-based resin. The base resin may be a transparent resin.

The scattering particles may be titanium oxide ($TiO_2$) or silica-based nanoparticles. The scattering particles may scatter incident light to increase an amount of light to be provided to an outside. In an embodiment of the disclosure, at least one of the first light control pattern WC1 and the third light control pattern WC3 may not include the scattering particles.

A quantum dot may be a particle that converts a wavelength of incident light. The quantum dot is a material with a crystal structure of several nanometers, and include or is composed of hundreds to thousands of atoms, and exhibits a quantum confinement effect that increases an energy band gap due to its small size. When light of a wavelength having an energy higher than the band gap is incident on the quantum dot, the quantum dot absorbs the light and becomes an excited state, and falls to a ground state while emitting light of a specific wavelength. The emitted wavelength of light has a value corresponding to the band gap. A size and a composition of the quantum dot may be adjusted to control light-emitting characteristics due to the quantum confinement effect A core of each quantum dot may include at least one selected from a group II-VI compound, a group III-V compound, a group III-VI compound, a group I-III-VI compound, a group IV-VI compound, a group IV element, a group IV compound, and combinations thereof.

The group II-VI compound may include at least one selected from a binary compound such as CdSe, CdTe, CdS, ZnS, ZnSe, ZnTe, ZnO, HgS, HgSe, HgTe, MgSe, MgS, and mixtures thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound such asHgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-VI compound may include a binary compound such as $In_2S_3$ and $In_2Se_3$; a ternary compound such as $InGaS_3$ and $InGaSe_3$; or any combination thereof.

The group compound may include at least one selected from a ternary compound such as AgInS, $AgInS_2$, CuInS, $CuInS_2$, $AgGaS_2$, $CuGaS_2$ $CuGaO_2$, $AgGaO_2$, $AgAlO_2$, and mixtures thereof, or a quaternary compound such as $AgIn-GaS_2$ and $CuInGaS_2$.

The group III-V compound may include at least one selected from a binary compound such as GaN, GaP, GaAs, GaSb, AlN, AlP, AlAs, AlSb, InN, InP, InAs, InSb, and mixtures thereof; a ternary compound such as GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In an embodiment, for example, the group III-V compound may further include a group II metal. In an embodiment, for example, InZnP or the like may be selected as the III-II-V compound.

The group IV-VI compound may include at least one selected from a binary compound such as SnS, SnSe, SnTe, PbS, PbSe, PbTe, and mixtures thereof; a ternary compound such as SnSeS, SnSeTe, SnSTe, PbSeS, PbSeTe, PbSTe, SnPbS, SnPbSe, SnPbTe, and mixtures thereof; and a quaternary compound such as SnPbSSe, SnPbSeTe, SnPbSTe, and mixtures thereof. The group IV element may include at least one selected from Si, Ge, and mixtures thereof. The group IV compound may be a binary compound such as SiC, SiGe, and mixtures thereof.

In an embodiment, the binary compound, the ternary compound, or the quaternary compound may be present in the particle and at a uniform concentration, or may be present in the same particle such that a concentration distribution is partially varying. A core/shell structure in which one quantum dot surrounds another quantum dot may be provided. An interface between the core and the shell may have a concentration gradient in which a concentration of an element present in the shell decreases as it goes toward a center.

In an embodiment, the quantum dot may have a core-shell structure including a core including the aforementioned nanocrystal and a shell surrounding the core. The shell of the quantum dot may serve as a protective layer to prevent chemical denaturation of the core to maintain semiconductor characteristics thereof and/or as a charging layer to impart electrophoresis ability to the quantum dot. The shell may be composed of a single layer or multiple layers. An interface between the core and the shell may have a concentration gradient in which a concentration of an element present in the shell decreases as it goes toward a center. In an embodiment, the shell of the quantum dot may include an oxide of a metal or a non-metal, a semiconductor compound, or a combination thereof.

In an embodiment, for example, the oxide of the metal or the non-metal may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$. The disclosure is not limited thereto.

In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc. The disclosure is not limited thereto The quantum dot may have a full width of half maximum ("FWHM") of a light-emitting wavelength spectrum of about 45 nm or smaller, e.g., FWHM of a light-emitting wavelength spectrum of about 40 nm or smaller, or FWHM of a light-emitting wavelength spectrum of about 30 nm or smaller, and may have improved color purity or color reproducibility in this range. Further, light emitted through the quantum dots may emit in all directions. Thus, a wide viewing angle may be improved.

Further, a shape of each of quantum dots is not particularly limited to those generally used in the art. In an embodiment, the shape of each of quantum dots may be spherical, pyramidal, multi-arm, or cubic nanoparticle, nanotube, nanowire, nanofiber, nanoplate-shaped particle, etc.

The quantum dots may control the color of emitted light therefrom according to a particle size, and accordingly, the quantum dots may have various light-emitting colors such as blue, red, and green.

The third insulating layer 200-3 may cover the partitioning wall BW, the first light control pattern WC1, the second light control pattern WC2, and the third light control pattern WC3. In an embodiment, for example, the third insulating layer 200-3 may be an inorganic film sealing the partitioning wall BW, the first light control pattern WC1, the second light control pattern WC2, and the third light control pattern WC3.

Figure 5A:
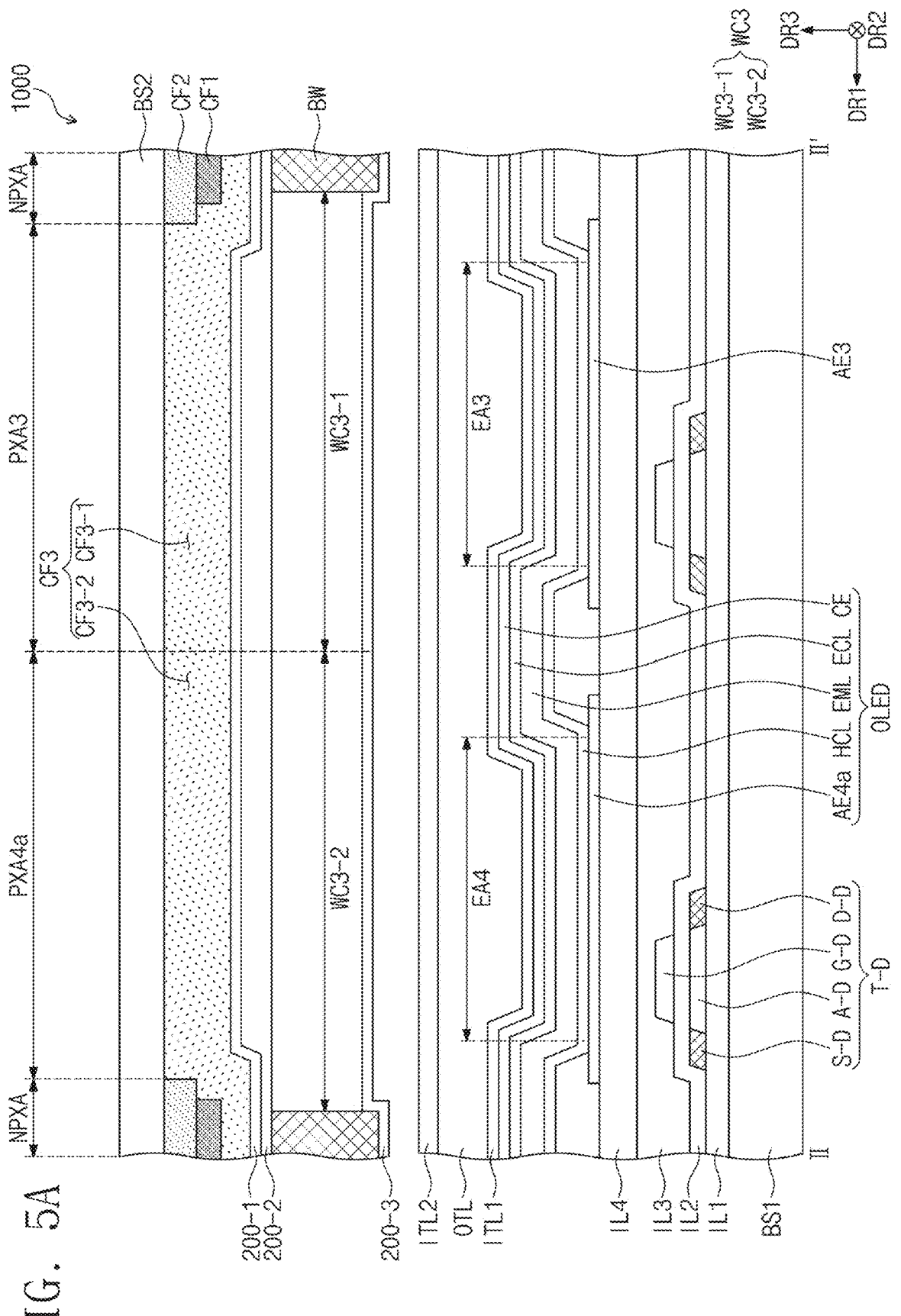
FIG. 5A and FIG. 5B are cross-sectional views taken along II-II' of FIG. 3 according to an embodiment of the disclosure.

FIG. 5A is a cross-sectional view taken along II-II' of FIG. 3 according to an embodiment of the disclosure. In FIG. 5A, the same or like reference characters are used to label the same or like components as those described with reference to FIG. 4, and any repetitive detailed description thereof will hereinafter be omitted.

FIG. 5A illustrates the third pixel area PXA3 of one pixel unit PXU and a fourth pixel area PXA4a of another pixel unit PXU adjacent to one pixel unit PXU as shown in FIG. 3.

Referring to FIG. 3 to FIG. 5A, the third pixel electrode AE3 may be disposed to correspond to the third pixel area PXA3, and a fourth pixel electrode AE4a may be disposed to correspond to the fourth pixel area PXA4a. As used herein, "corresponding" means that the two components overlap each other in the thickness direction DR3 of the display device 1000, and is not limited to a configuration that the two components have a same area as each other.

The third color filter CF3 may include a first color filter portion CF3-1 and a second color filter portion CF3-2.

The first color filter portion CF3-1 may overlap the third pixel area PXA3. The second color filter portion CF3-2 may overlap the fourth pixel area PXA4a. The first color filter portion CF3-1 and the second color filter portion CF3-2 may be integral to each other, or integrally formed with each other as a single unitary indivisible part, to define the third color filter CF3.

In a plan view, the third color filter CF3 may overlap at least two light-emitting elements OLED.

The third light control pattern WC3 may include a first light control pattern portion WC3-1 and a second light control pattern portion WC3-2.

The first light control pattern portion WC3-1 may overlap the third pixel area PXA3. The second light control pattern portion WC3-2 may overlap the fourth pixel area PXA4a. The first light control pattern portion WC3-1 and the second light control pattern portion WC3-2 may be integral with each other to define the third light control pattern WC3.

A JND index may be used to measure edge discoloration phenomenon. The JND index may refer to an index of a minimum discrimination difference of light that is recognized when the pixel unit is viewed from a place spaced apart by 20 centimeters (cm) therefrom. That is, the higher the JND index, the greater a degree of edge discoloration.

Contrary to the disclosure, when, in a plan view, the third light control pattern WC3 overlaps one light-emitting element OLED, the third pixel area PXA3 and the fourth pixel area PXA4 may not be respectively divided into the third light-emitting area EA3 and a fourth light-emitting area EA4 but may be provided as one pixel area. In this case, the display device may operate such that the color filter unit (CFU, see FIG. 6) is defined as one pixel unit. Edge discoloration may occur at a top edge, a bottom edge, a right edge, and a left edge of the pixel unit. At the top edge, green light may be recognized due to edge discoloration. The JND index of the top edge may be 6.3. At the bottom edge, magenta light may be recognized due to edge discoloration. The magenta light may be a mixture of red light and blue light. The JND index of the bottom edge may be 6.6. At the right edge, red light may be recognized due to edge discoloration. The JND index of the right edge may be 4.5. At the left edge, cyan light may be recognized due to edge discoloration. The JND index of the left edge may be 1.8.

According to an embodiment of the disclosure, in a plan view, the third light control pattern WC3 may overlap at least two light-emitting elements OLED. The third pixel area PXA3 and the fourth pixel area PXA4 may operate in a divided manner or independently of each other. The display device 1000 may operate on a pixel unit PXU basis. Edge discoloration may occur at the top edge, the bottom edge, the right edge, and the left edge of the pixel unit PXU. At the top edge, green light may be recognized due to edge discoloration. The JND index of the top edge may be in a range of 2.0 to 2.5. In an embodiment, for example, the JND index of the top edge may be 2.3. At the bottom edge, green light may be recognized due to edge discoloration. The JND index of the bottom edge may be in a range of 2.0 to 2.5. In an embodiment, for example, the JND index of the top edge may be 2.3. At the right edge, red light may be recognized due to edge discoloration. The JND index of the right edge may be in a range of 3.5 to 4.0. In an embodiment, for example, the JND index of the right edge may be 3.7. At the left edge, cyan light may be recognized due to edge discoloration. The cyan light may be a mixture of blue light and green light. The JND index of the left edge may be in a range of 2.0 to 2.5. In an embodiment, for example, the JND index of the left edge may be 2.5. Compared to a case where the color filter unit (CFU, see FIG. 6) acts as one pixel unit, the edge discoloration at each of the top edge and the bottom edge of the pixel unit PXU may be reduced in an embodiment of the disclosure where the pixel unit PXU acts as one pixel unit. The overall edge discoloration phenomenon of the pixel unit PXU may be reduced. Accordingly, embodiments of the disclosure may provide the display device 1000 with improved display quality.

According to an embodiment of the disclosure, light provided from the third pixel electrode AE3 and light provided from the fourth pixel electrode AE4a may be provided through the third color filter CF3. In such an embodiment, luminance of the light viewed from the third pixel area PXA3 may be provided from the light provided from the third pixel electrode AE3 and the light provided from the fourth pixel electrode AE4a. Luminance of the light viewed from the fourth pixel area PXA4a may be provided from the light provided from the third pixel electrode AE3 and the light provided from the fourth pixel electrode AE4a. Accordingly, embodiments of the disclosure may provide the display device 1000 with improved luminance.

Figure 5B:
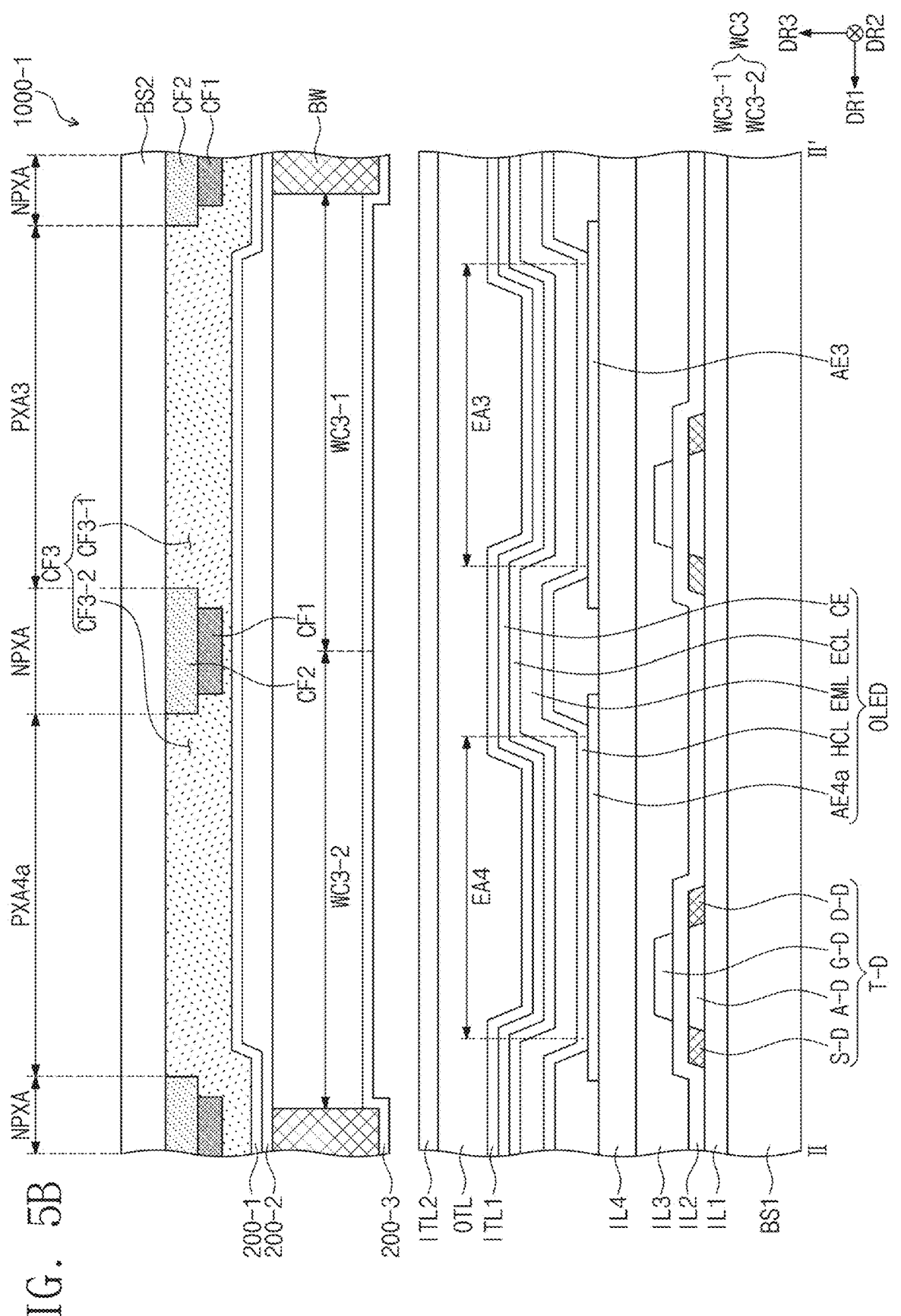

FIG. 5B is a cross-sectional view taken along of FIG. 3 according to an alternative embodiment of the disclosure. In FIG. 5B, the same or like reference characters are used to label the or like components as those described above with reference to FIG. 5A, and any repetitive detailed description thereof will hereinafter be omitted.

Referring to FIG. 5B, in a plan view, the peripheral area NPXA may be defined between the third pixel electrode AE3 and the fourth pixel electrode AE4a of an electronic device 1000-1. The second color filter CF2, the first color filter CF1, and the third color filter CF3 may be sequentially disposed under the second base substrate BS2 and in the peripheral area NPXA. The first color filter CF1, the second color filter CF2, and the third color filter CF3 may function as a light blocking member.

According to an embodiment of the disclosure, the third pixel electrode AE3 may provide green light, and the fourth pixel electrode AE4a may provide green light. Green light provided from the pixels may be separated from each other in the peripheral area NPXA disposed between the first color filter portion CF3-1 and the second color filter portion CF3-2. That is, light provided from the third pixel electrode AE3 may be provided through the first color filter portion CF3-1, and light provided from the fourth pixel electrode AE4a may be provided through the second color filter portion CF3-2. Accordingly, embodiments of the disclosure may provide the display device 1000-1 with improved display quality.

Figure 6:
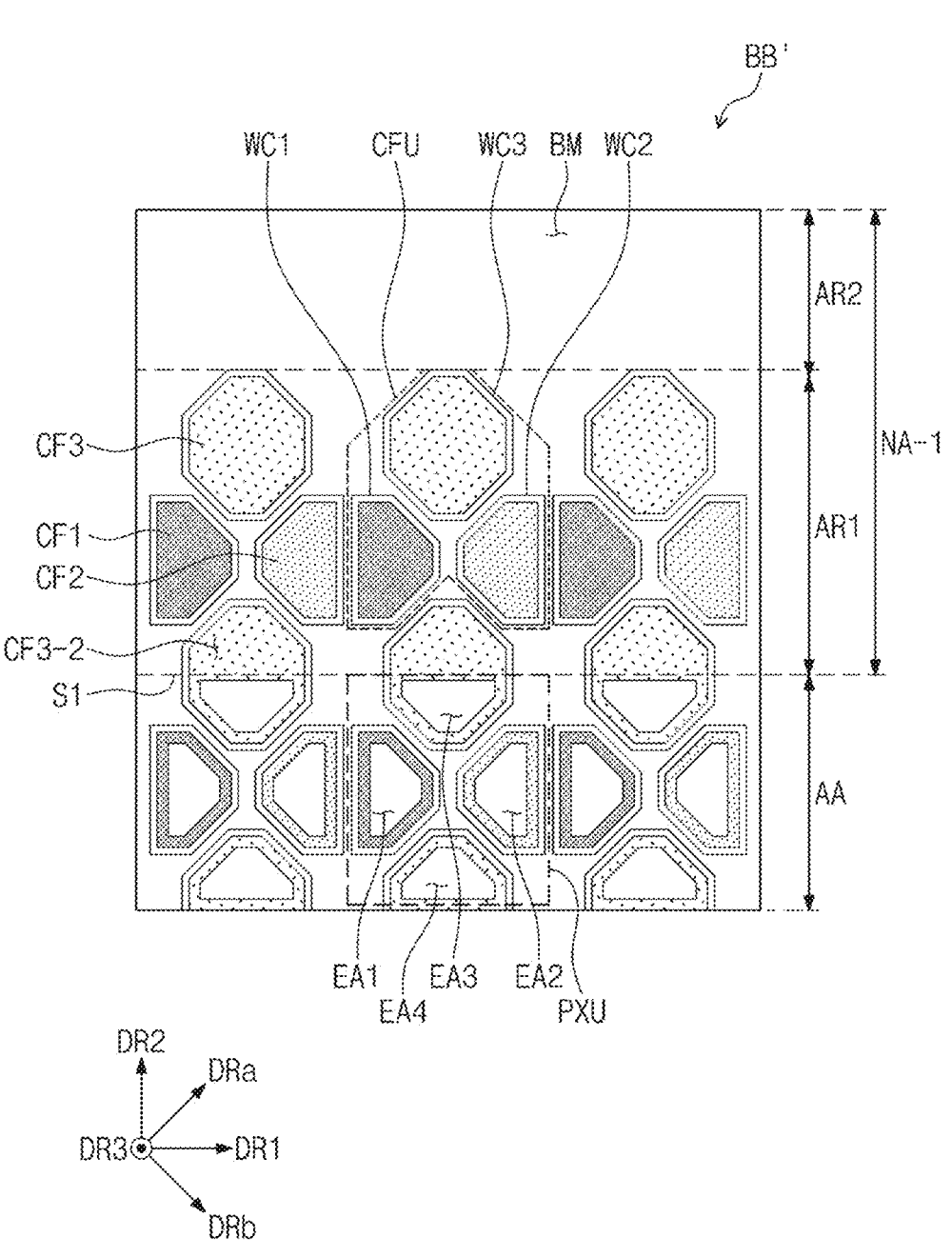
FIG. 6 is a plan view showing a BB' area of FIG. 1A according to an embodiment of the disclosure.
Figure 7:
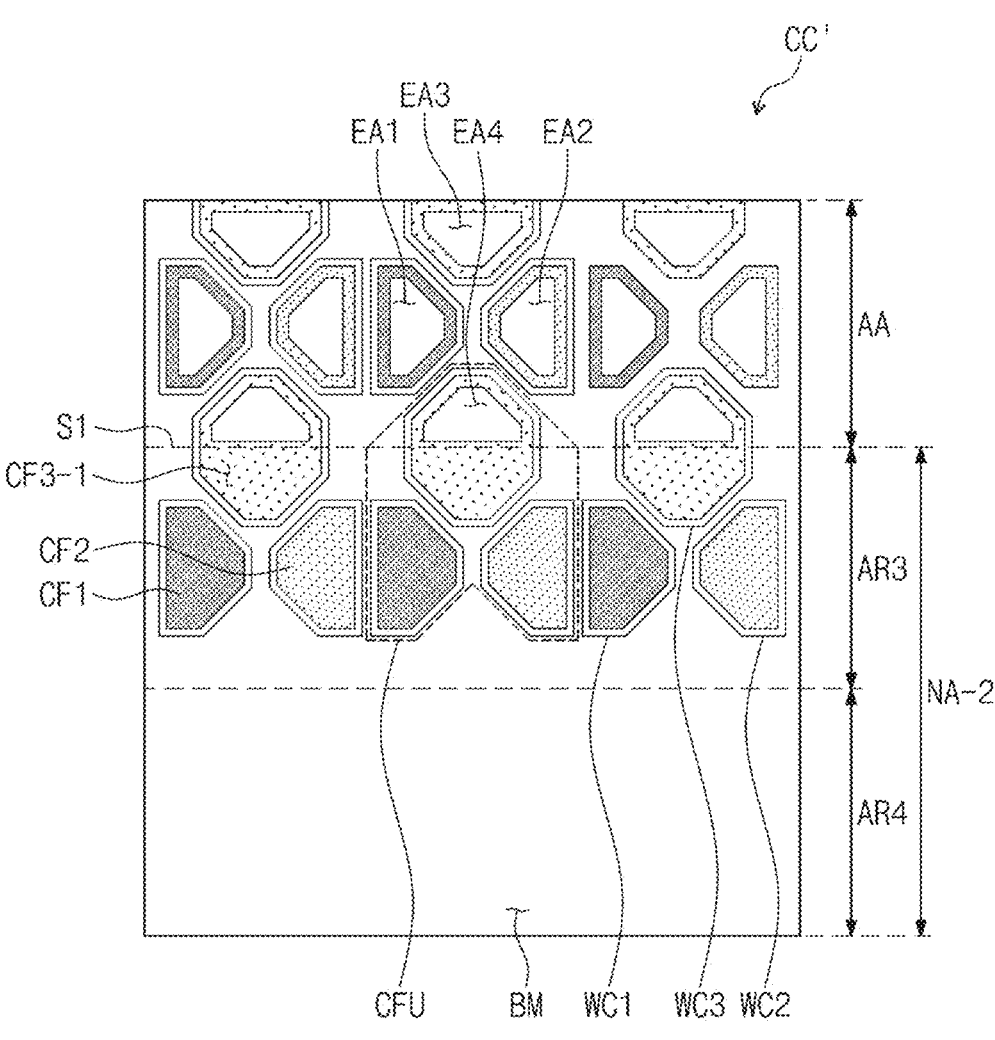
FIG. 7 is a plan view showing the BB' area of FIG. 1A according to an embodiment of the disclosure.
Figure 7:
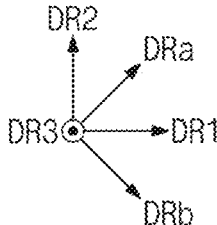

FIG. 6 is a plan view showing a BB' area of FIG. 1A according to an embodiment of the disclosure, and FIG. 7 is a plan view showing the CC' area of FIG. 1A according to an embodiment of the disclosure.

Referring to FIG. 6 and FIG. 7, the three color filters CF1, CF2, and CF3 may constitute one color filter unit CFU. A plurality of color filter units CFU may be provided. The plurality of color filter units CFU may be arranged along the first direction DR1 and the second direction DR2.

The first color filter CF1 may be spaced apart from the second color filter CF2 in the first direction DR1.

The third color filter CF3 may be spaced apart from the first color filter CF1 in the first intersecting direction DRa.

The third color filter CF3 may be spaced apart from the second color filter CF2 in the second intersecting direction DRb.

An area of the third color filter CF3 may be larger than an area of each of the first color filter CF1 and the second color filter CF2.

The peripheral area NDA (see FIG. 1A) may include a first peripheral area NA-1 adjacent to a first side S1 of the active area AA and a second peripheral area NA-2 adjacent to a second side S2 spaced apart from the first side S1 in the second direction DR2.

The first peripheral area NA-1 may include a first area AR1 and a second area AR2. The second area AR2 may be spaced apart from the active area AA while the first area AR1 is interposed therebetween.

The first color filter CF1, the second color filter CF2, the first color filter portion CF3-1, and the third color filter CF3 may be disposed in the first area AR1.

The second area AR2 may include a black matrix BM. The black matrix BM may include a light-blocking material, for example, a conventional black component. The partitioning wall BW may include black dye and black pigment mixed with the base resin.

The second peripheral area NA-2 may include a third area AR3 and a fourth area AR4. The fourth area AR4 may be spaced from the active area AA while the third area AR3 is interposed therebetween.

The first color filter CF1, the second color filter CF2, and the first color filter portion CF3-1 may be disposed in the third area AR3.

The fourth area AR4 may include black matrix BM.

A size of the first area AR1 may be larger than a size of the third area AR3.

The third color filter CF3 may be further formed in the first area AR1 while the third color filter CF3 is absent in the third area AR3.

One pixel unit PXU may include the first to fourth pixel areas PXA1, PXA2, PXA3, and PXA4. A manufacturing method of the display device 1000 according to an embodiment of the disclosure may not respectively apply color filters to the first to fourth pixel areas PXA1, PXA2, PXA3, and PXA4, but may apply the first to third color filters CF1, CF2, and CF3 according to the color filter unit CFU.

According to an embodiment of the disclosure, the third color filter CF3 divided into the first color filter portion CF3-1 and the second color filter portion CF3-2 may be provided or printed at once in each of the plurality of pixel units PXU. In such an embodiment, the first color filter CF1, the second color filter CF2, the first color filter portion CF3-1, and the second color filter portion CF3-2 may not respectively be applied. Rather, the first color filter CF1, the second color filter CF2, the first color filter portion CF3-1, and the second color filter portion CF3-2 may be applied on a color filter unit CFU basis. Thus, productivity of the display device 1000 may be improved. Accordingly, the disclosure may provide the display device 1000 manufacturing method with improved process efficiency.

Figure 8:
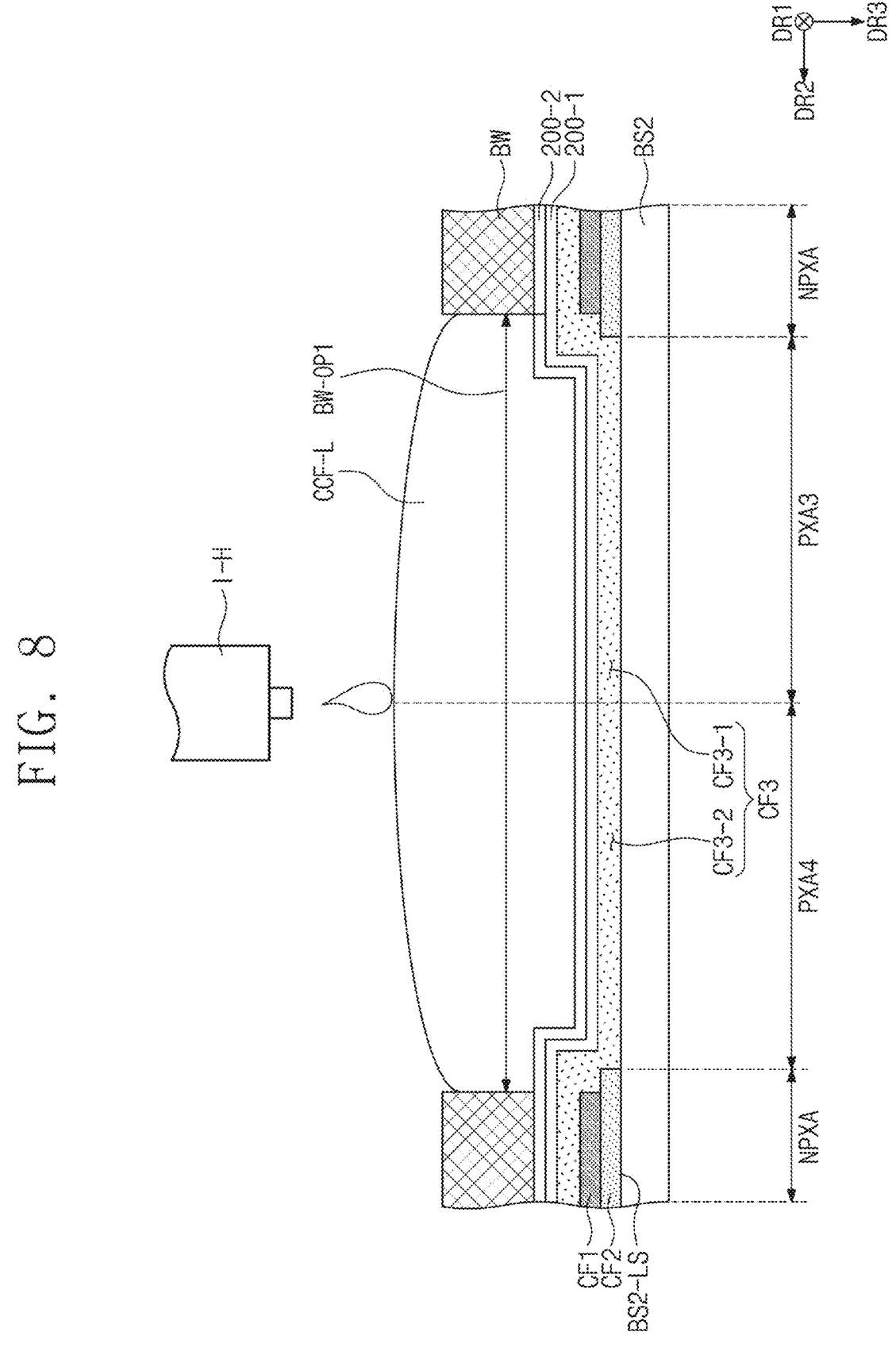
FIG. 8 is a cross-sectional view illustrating a method of manufacturing a display device corresponding to a cross-section taken along II-II' of FIG. 3 according to an embodiment of the disclosure.

FIG. 8 is a cross-sectional view illustrating a method of manufacturing a display device corresponding to a cross-section cut along II-II' of FIG. 3 according to an embodiment of the disclosure. In FIG. 8, the same or like reference character are used to label the or like components as those described above with reference to FIG. 5A, and any repetitive detailed description thereof will hereinafter be omitted.

FIG. 8 shows a state in which the second substrate 200 of FIG. 5A is upside down in the third direction DR3. That is, FIG. 8 is based on the bottom surface BS2-LS of the second base substrate BS2.

FIG. 8 shows the third pixel area PXA3 of one pixel unit PXU and the fourth pixel area PXA4 of another pixel unit adjacent to the third pixel area PXA3.

The second color filter CF2 may be provided or formed on the second base substrate BS2. The first color filter CF1 may be provided or formed on the second color filter CF2.

The third color filter CF3 corresponding to the third pixel area PXA3 and the fourth pixel area PXA4 may be provided or formed on the first color filter CF1. The third color filter CF3 may include the first color filter portion CF3-1 and the second color filter portion CF3-2. The first color filter portion CF3-1 may overlap the third pixel area PXA3. The second color filter portion CF3-2 may overlap the fourth pixel area PXA4.

The first insulating layer 200-1 and the second insulating layer 200-2 may be provided or formed on the third color filter CF3 through a deposition process.

After the first to third color filters CF1, CF2, and CF3 are formed, the partitioning wall BW may be provided or formed thereon.

The first opening BW-OP1 corresponding to the third pixel area PXA3 of one pixel unit PXU and the fourth pixel area PXA4 of another pixel unit adjacent to the third pixel area PXA3 may be formed in the partitioning wall BW. A preliminary partitioning layer of the partitioning wall BW may be formed, and then the plurality of first openings BW-OP1 may be formed in the preliminary partitioning layer through a photo process.

The first opening BW-OP1 may overlap the third pixel area PXA3 and the fourth pixel area PXA4.

A solution CCF-L may be provided within the first opening BW-OP1. The third light control pattern WC3 (see FIG. 4) may be formed by curing the solution CCF-L. The solution to form the third light control pattern (WC3, see FIG. 4) may be a quantum dot solution. In an embodiment, for example, the solution to form the first light control pattern in FIG. 4 (WC1, see FIG. 4) may be a quantum dot solution, and the solution to form the second light control pattern (WC2, see FIG. 4) may be a scattering particle solution. However, this is an example. The solution according to an embodiment of the disclosure is not limited thereto.

The solution CCF-L may be provided through an inkjet process. The inkjet process may provide the solution CCF-L to the first opening BW-OP1 from an inkjet head I-H.

In a case where the third pixel area PXA3 and the fourth pixel area PXA4 overlapping the first opening BW-OP1 into which the solution CCF-L is injected may not respectively be divided but may be provided as one pixel area, the color filter unit CFU (see FIG. 6) may act as one pixel unit. In this case, edge discoloration may occur at the top edge, the bottom edge, the right edge, and the left edge of the pixel unit. According to an embodiment of the disclosure, in a plan view, the first opening BW-OP1 in which the third light control pattern WC3 is formed may overlap with at least two light-emitting elements OLED. The third pixel area PXA3 and the fourth pixel area PXA4 may operate in a divided manner. The display device 1000 may operate on a pixel unit PXU basis. Compared to a case where the color filter unit (CFU, see FIG. 6) acts as one pixel unit, the edge discoloration at each of the top edge and the bottom edge of the pixel unit PXU may be reduced in an embodiment where the pixel unit PXU acts as one pixel unit. The overall edge discoloration phenomenon of the pixel unit PXU may be reduced. Accordingly, the disclosure may provide the display device 1000 with improved display quality.

Figure 9:
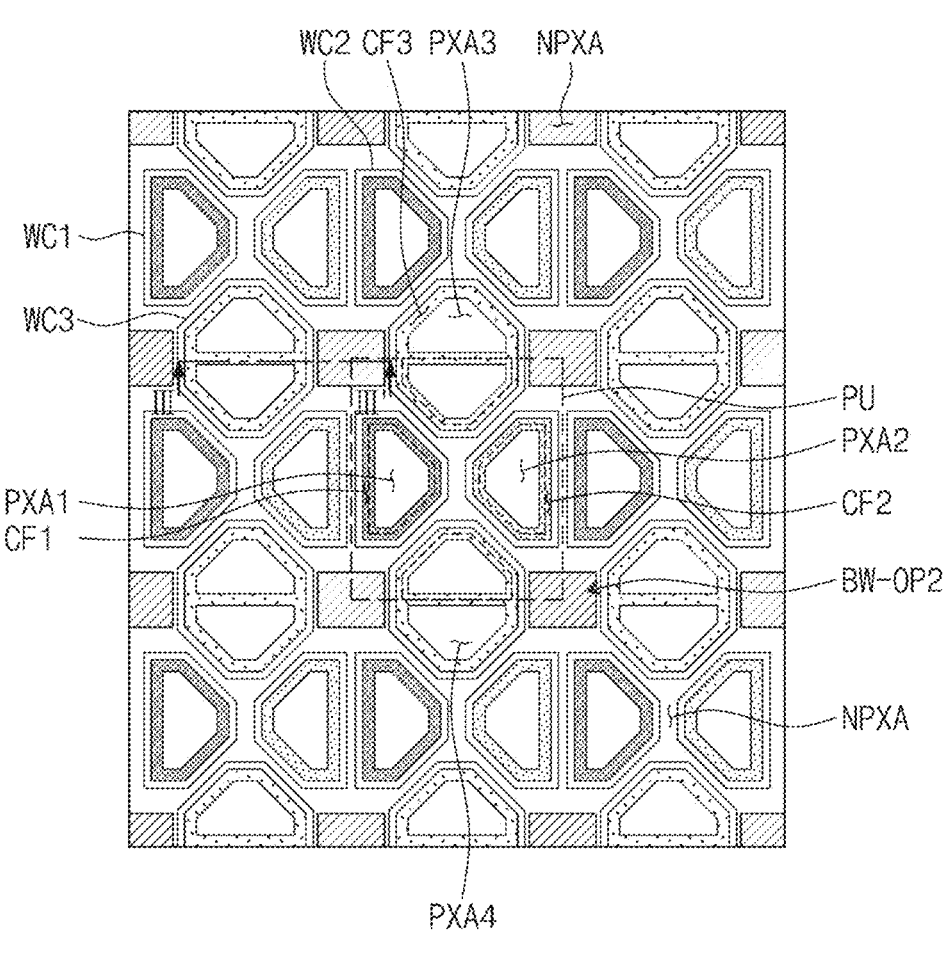
FIG. 9 is a plan view showing an area corresponding to the AA' area of FIG. 1A according to an embodiment of the disclosure.
Figure 9:
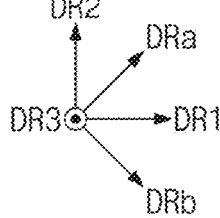

FIG. 9 is a plan view showing an area corresponding to an area AA' of FIG. 1A according to an embodiment of the disclosure. In FIG. 9, the same or like reference characters are used to label the same or like components as those described above with reference to FIG. 3, and any repetitive detailed description thereof will hereinafter be omitted.

Referring to FIG. 9, the first opening BW-OP1 and a second opening BW-OP2 may be defined in the partitioning wall BW (see FIG. 4). The second opening BW-OP2 may be spaced apart from the first opening BW-OP1 in the first direction DR1.

The second opening BW-OP2 may be disposed between the third color filters CF3 adjacent to each other. The second opening BW-OP2 may be disposed between the third light control patterns WC3 adjacent to each other (see FIG. 4).

Figure 10A:
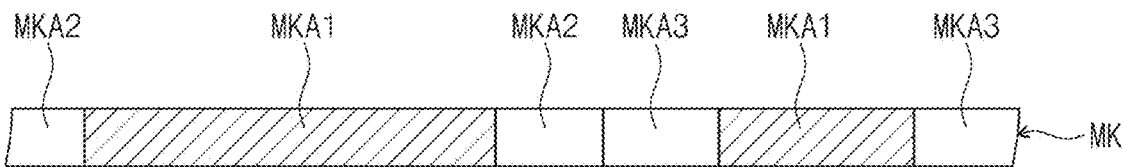
FIG. 10A to FIG. 10C are cross-sectional views of a method of manufacturing a display device, corresponding to a cross-section take along III-III' of FIG. 9, according to an embodiment of the disclosure.
Figure 10A:
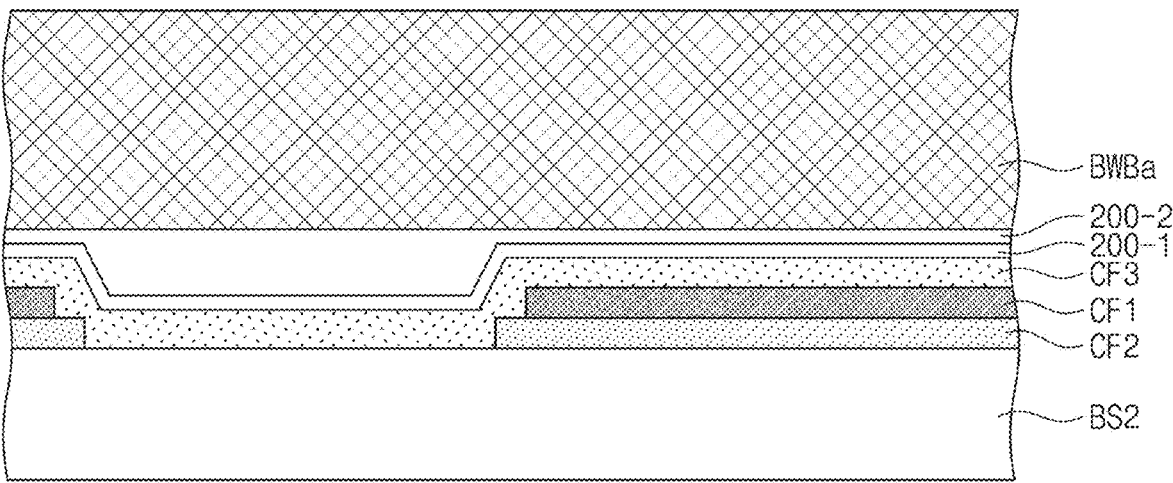
Figure 10A:
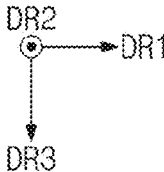
Figure 10B:
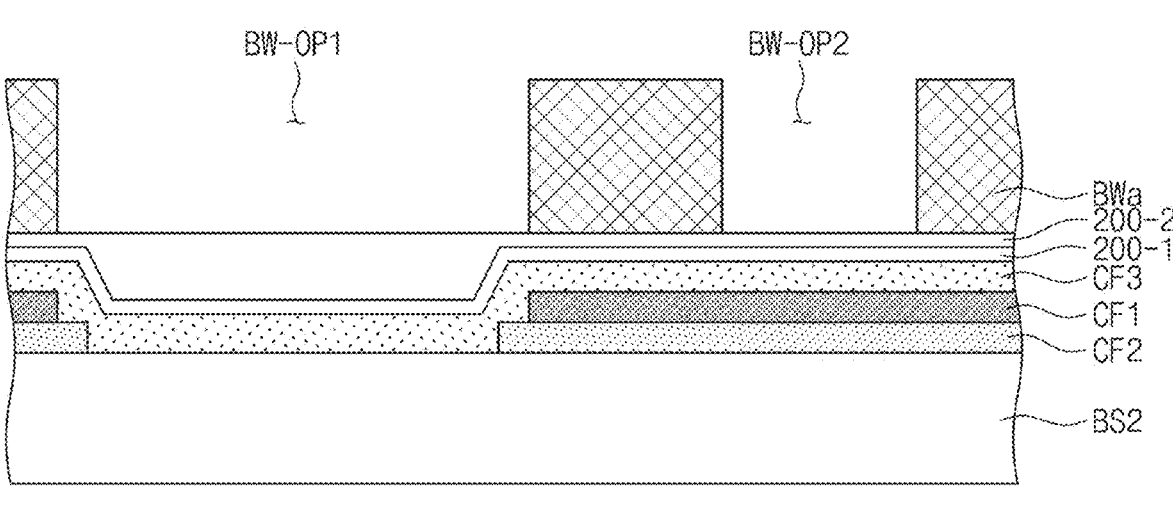
Figure 10B:
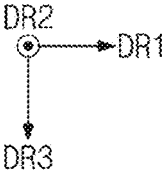
Figure 10C:
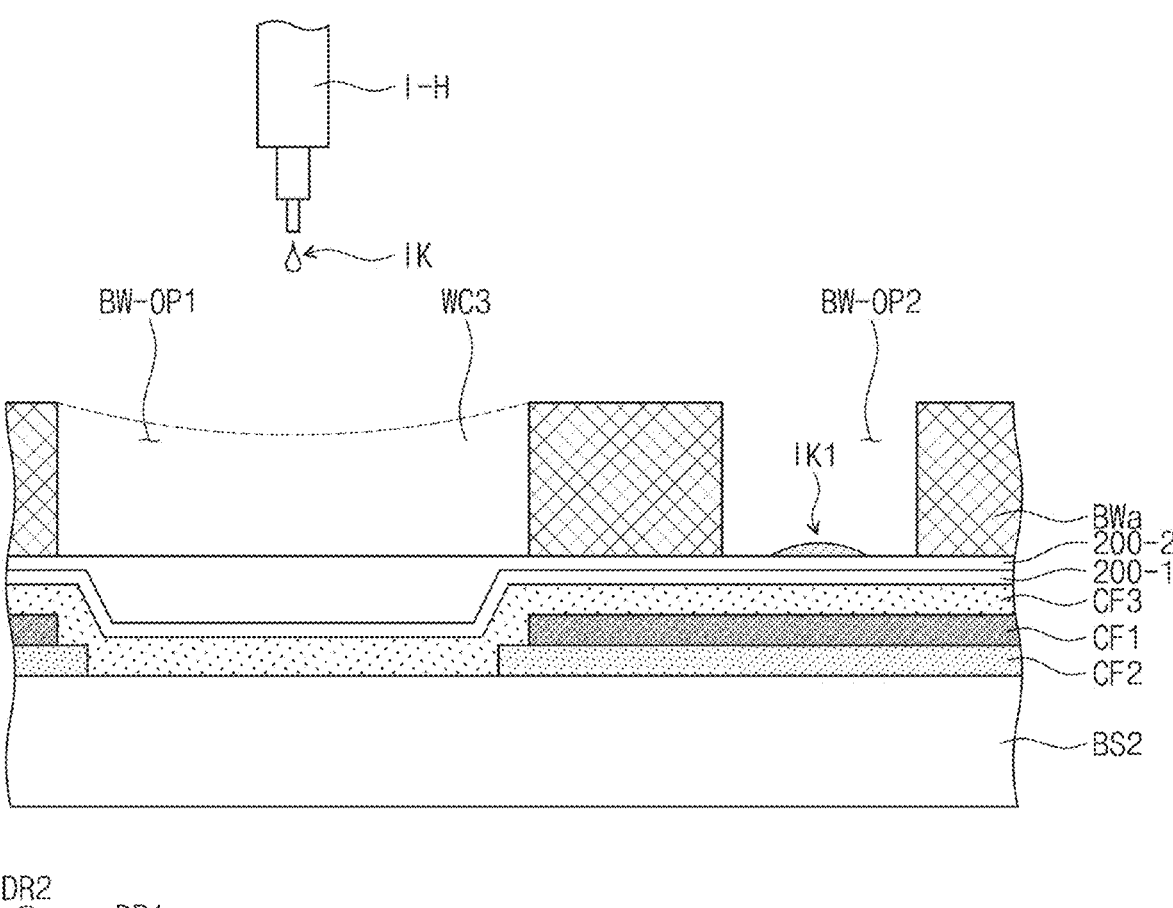

FIG. 10A to FIG. 10C are cross-sectional views of a method of manufacturing a display device, corresponding to a cross-section taken along line III-III' of FIG. 9, according to an embodiment of the disclosure.

Referring to FIG. 10A to FIG. 10C, in an embodiment of a method of manufacturing a display device, the first color filter CF1, the second color filter CF2, and the third color filter CF3 may be provided or formed on one surface of the second base substrate BS2. Thereafter, the first insulating layer 200-1 covering the first to third color filters CF1, CF2, and CF3 may be provided or formed on the first to third color filters CF1, CF2, and CF3. The first insulating layer 200-1 may include an inorganic film.

The second insulating layer 200-2 may be provided or formed on the first insulating layer 200-1. The second insulating layer 200-2 may provide a flat surface. The second insulating layer 200-2 may include an organic film. However, this is an example. Alternatively, the first insulating layer 200-1 and/or the second insulating layer 200-2 may be omitted.

FIG. 10A to FIC. 10C illustrate a portion of a display device including the third pixel area PXA3 and the fourth pixel area PXA4 overlapping the third color filter CF3. However, the first opening BW-OP1 overlapping the first pixel area PXA1 or the second pixel area PXA2 may be formed in a same way.

Referring to FIG. 9 and FIG. 10A, a partitioning wall layer BWBa may be provided or formed on the second insulating layer 200-2. Thereafter, a mask MK may be aligned on the partitioning wall layer BWBa.

The mask MK may include a first mask area MKA1, a second mask area MKA2, and a third mask area MKA3. The first mask area MKA1 may have a coating including or made of a light blocking material and thus have a property of blocking light. The second mask area MKA2 may have a property of transmitting light therethrough. The third mask area MKA3 may block at least a portion of light.

The first mask area MKA1 may be disposed in an area corresponding to at least one of the plurality of color filters CF1, CF2, and CF3. The second mask area MKA2 and the third mask area MKA3 may be aligned in areas overlapping the peripheral area NPXA.

Referring to FIG. 10B, a portion of the partitioning wall layer BWBa corresponding to the first mask area (MKA1 FIG. 10A) may be removed to form the first opening BW-OP1 and the second opening BW-OP2.

The partitioning wall layer BWBa may be patterned to form a plurality of first openings BW-OP1 and second openings BW-OP2. A process of forming the partitioning wall (BW, see FIG. 4) may be referred to as a patterning process. The patterning step may include a process of exposing the partitioning wall layer BWBa in a state in which the mask MK is aligned. In an embodiment of the disclosure, a portion of the partitioning wall layer BWBa that has received light in the exposing step may be cured, and a portion of the partitioning wall layer BWBa that has not received light may be removed.

The second mask area (MKA2, see FIG. 10A) may transmit an entirety of the light therethrough, and the third mask area (MKA3, see FIG. 10A) may transmit only a portion of the light therethrough. An exposure amount of a portion of the partitioning wall layer BWBa overlapping the second mask area (MKA2, see FIG. 10A) may be greater than an exposure amount of another portion of the partitioning wall layer BWBa overlapping the third mask area (MKA3, see FIG. 10A). The greater the exposure amount, the greater liquid repellency, while the smaller the exposure amount, the smaller the liquid repellency.

FIG. 10C shows a process of forming the plurality of light control patterns WC3 respectively disposed in the plurality of first openings BW-OP1. Using an inkjet process, solution IK (or ink) may be provided into the first opening BW-OP1. An inkjet head I-H may include a nozzle that provides the solution IK. The inkjet head I-H may provide the solution IK into the first opening BW-OP1 while moving in a predetermined direction. When the solution IK is dried, the third light control pattern WC3 may be formed. Although the third light control pattern WC3 is illustrated in FIG. 10C by way of example, the first light control pattern WC1 and the second light control pattern WC2 may be formed using a same process as that of the third light control pattern WC3. In the process of forming the first light control pattern WC1 and the third light control pattern WC3, the solution IK may include a quantum dot solution.

In the process of providing the solution IK through the inkjet process, the solution IK may be incorrectly ejected and thus provided to a portion other than the first opening BW-OP1. The solution IK may be ejected to a top surface of a partitioning wall BWa or the second opening BW-OP2. The partitioning wall BWa adjacent to the second opening BW-OP2 may have relatively low liquid repellency. The solution IK may be spread to have a partial shape of a sphere with a large radius of curvature due to the partitioning wall BWa having low liquid repellency. A height formed by the incorrectly ejected solution IK may be reduced.

In an embodiment, the solution IK1 that has been impacted on the partitioning wall BWa adjacent to the second opening BW-OP2 may be accommodated in the second opening BW-OP2. In such an embodiment, the incorrectly ejected solution IK1 may not remain on a top surface of the partitioning wall BWa, so that a height difference formed by the solution IK1 may not occur.

In a case where the solution IK is incorrectly ejected in the inkjet process and thus disposed on a top surface of the partitioning wall BWa, a thickness of an incorrectly ejected area of the partitioning wall BWa may be increased by the height of the incorrectly ejected solution IK. In this case, in the process of bonding the first substrate (100, see FIG. 4) and the second substrate (200, see FIG. 4) to each other, a gap defect between the upper and lower substates may occur. According to an embodiment of the disclosure, the second opening BW-OP2 may provide a space where the incorrectly ejected solution IK1 may be accommodated. In such an embodiment, even when the solution IK is incorrectly ejected in the inkjet process, the incorrectly ejected solution IK1 may be accommodated in the second opening BW-OP2. Thus, a thickness of the partitioning wall BWa may be kept constant. Accordingly, probability that the gap defect between the upper and lower substrates or cracks in the thin-film encapsulation layer occur may be reduced or eliminated in the subsequent bonding process. Therefore, the disclosure may provide the display device 1000 (1000, see FIG. 1A) with improved reliability.

Thereafter, a process of curing the solution IK may be performed to form the plurality of light control patterns WC1, WC2, and WC3. Then, a process of forming the display element layer (EL, see FIG. 4) may proceed. After forming the display element layer (EL, see FIG. 4), a process of bonding the first substrate (100, see FIG. 4) and the second substrate (200, see FIG. 4) to each other may proceed.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device in which an active area including a plurality of pixel units, which respectively includes a first pixel area, a second pixel area, a third pixel area and a fourth pixel area and respectively provides a source light, and a peripheral area adjacent to the active area are defined, the display device comprising:

a plurality of light-emitting elements including a first light-emitting element corresponding to the first pixel area, a second light-emitting element corresponding to the second pixel area, a third light-emitting element corresponding to the third pixel area, and a fourth light-emitting element corresponding to the fourth pixel area;

a first color filter overlapping the first pixel area, a second color filter overlapping the second pixel area, a first color filter portion overlapping the third pixel area, and a second color filter portion overlapping the fourth pixel area;

a first light control pattern disposed between the first color filter and the first light-emitting element;

a second light control pattern disposed between the second color filter and the second light-emitting element;

a first light control pattern portion disposed between the first color filter portion and the third light-emitting element; and a second light control pattern portion disposed between the second color filter portion and the fourth light-emitting element, wherein the first light control pattern portion of one pixel unit and the second light control pattern portion of another pixel unit adjacent to the one pixel unit are integrally formed with each other as a single unitary indivisible part to define a third light control pattern.

2. The display device of claim 1, wherein the first pixel area and the second pixel area are spaced apart from each other in a first direction, wherein the third pixel area and the fourth pixel area are spaced apart from each other in a second direction intersecting the first direction, wherein the first pixel area and the third pixel area are spaced apart from each other in a first intersecting direction intersecting the first direction and the second direction, wherein the first pixel area and the fourth pixel area are spaced apart from each other in a second intersecting direction intersecting the first intersecting direction, the first direction and the second direction.

3. The display device of claim 1, wherein the first color filter portion of the one pixel unit and the second color filter portion of the another pixel unit are integrally formed with each other as a single unitary indivisible part to define a third color filter.

4. The display device of claim 3, wherein the display device further includes a partitioning wall, and a plurality of first openings is defined in the partitioning wall in which the first light control pattern, the second light control pattern, and the third light control pattern are disposed, respectively.

5. The display device of claim 4, wherein
the third color filter is disposed on the partitioning wall,
the first color filter is disposed on the third color filter, and
the second color filter is disposed on the first color filter.

6. The display device of claim 4, wherein a second opening is defined in the partitioning wall to be spaced apart from the plurality of first openings in a plan view.

7. The display device of claim 6, wherein the second opening is disposed between third light control patterns adjacent to each other in the plan view.

8. The display device of claim 3,
wherein the first light control pattern converts the source light into a first color light,
wherein the second light control pattern transmits the source light therethrough, and
wherein the third light control pattern converts the source light into a second color light different from the first color light.

9. The display device of claim 8, wherein the first color light is a red light, and the second color light is a green light.

10. The display device of claim 3,
wherein the peripheral area includes a first peripheral area adjacent to a first side of the active area, and a second peripheral area adjacent to a second side of the active area spaced apart from the first side, and
wherein the third color filter is further disposed in the first peripheral area, and the third color filter is not disposed in the second peripheral area.

11. The display device of claim 10,
wherein the first peripheral area includes a first area and a second area spaced apart from the active area with the first area interposed therebetween,
wherein the second peripheral area includes a third area and a fourth area spaced apart from the active area with the third area interposed therebetween, and
wherein the device further includes a black matrix disposed in the second area and the fourth area.

12. The display device of claim 11, wherein a size of the first area is larger than a size of the third area.

13. The display device of claim 3, wherein the third color filter overlaps with at least two light-emitting elements in a plan view.

14. The display device of claim 1, wherein sizes of the first to fourth pixel areas are equal to each other.

15. The display device of claim 1, wherein the source light is a blue light.

16. A display device including:
a first substrate including a plurality of light-emitting elements which respectively provides a source light; and
a second substrate disposed on the first substrate,
wherein the second substrate includes:
a plurality of color filters including a first color filter, a second color filter, and a third color filter, wherein the third color filter includes a first color filter portion and a second color filter portion; and a first light control pattern, a second light control pattern, and a third light control pattern, wherein the third light control pattern includes a first light control pattern portion and a second light control pattern portion, wherein the first color filter, the second color filter, the first color filter portion, and the second color filter portion overlap the plurality of light-emitting elements, respectively, in a plan view, wherein in the plan view, the first light control pattern overlaps the first color filter, the second light control pattern overlaps the second color filter, the first light control pattern portion overlaps the first color filter portion, and the second light control pattern portion overlaps the second color filter portion, wherein an active area and a peripheral area adjacent to the active area are defined in the first substrate, wherein the peripheral area includes a first peripheral area adjacent to a first side of the active area, and a second peripheral area adjacent to a second side of the active area and spaced apart from the first side of the active area, wherein the first peripheral area includes a first area and a second area spaced apart from the first area with the active area interposed therebetween, wherein the first area overlaps the first color filter, the first color filter portion, the second color filter, and the third color filter in the plan view, wherein the second peripheral area includes a third area and a fourth area spaced apart from the third area with the active area interposed therebetween, and wherein the third area overlaps the first color filter, the first color filter portion, and the second color filter in the plan view.

17. The display device of claim 16, wherein the first color filter is spaced apart from the second color filter in a first direction, wherein the third color filter is spaced apart from the first color filter in a first intersecting direction intersecting the first direction, wherein the third color filter is spaced apart from the second color filter in a second intersecting direction intersecting the first intersecting direction and the first direction.

18. The display device of claim 16, wherein the source light is a blue light.

19. The display device of claim 16, wherein the second substrate further includes a black matrix disposed in the second area and the fourth area.

20. A display device including:

a base substrate defining an active area and a peripheral area adjacent to the active area;

a display element layer disposed on the base substrate, wherein the display element layer includes a plurality of light-emitting elements which provides a source light;

a plurality of first light control patterns disposed on the display element layer, wherein the plurality of first light control patterns converts the source light into a first color light;

a plurality of second light control patterns disposed on the display element layer, wherein the plurality of second light control patterns transmits the source light therethrough;

a plurality of third light control patterns disposed on the display element layer, wherein the plurality of third light control patterns converts the source light into a second color light different from the first color light;

a first color filter disposed on each of the plurality of first light control patterns;

a second color filter disposed on each of the plurality of second light control patterns; and a third color filter disposed on each of the plurality of third light control patterns, wherein each of the plurality of third light control patterns overlaps two light-emitting elements of the plurality of light-emitting elements, wherein the peripheral area includes a first peripheral area adjacent to a first side of the active area, and a second peripheral area adjacent to a second side of the active area spaced apart from the first side, and wherein the third color filter is further disposed in the first peripheral area, and the third color filter is not disposed in the second peripheral area.

21. The display device of claim 20, wherein the source light is a blue light.

22. The display device of claim 20, wherein the first color light is a red light, and the second color light is a green light.

* * * * *